(12) United States Patent
Lin et al.

(10) Patent No.: US 11,942,439 B2
(45) Date of Patent: Mar. 26, 2024

(54) SEMICONDUCTOR PACKAGE STRUCTURE

(71) Applicant: MediaTek Inc., Hsin-Chu (TW)

(72) Inventors: Tzu-Hung Lin, Hsin-Chu (TW);
Yung-Chang Lien, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/744,297

(22) Filed: May 13, 2022

(65) Prior Publication Data
US 2022/0278055 A1 Sep. 1, 2022

Related U.S. Application Data

(60) Division of application No. 15/930,645, filed on May 13, 2020, now Pat. No. 11,362,044, which is a continuation-in-part of application No. 16/813,898, filed on Mar. 10, 2020, now Pat. No. 11,387,176, said application No. 15/930,645 is a continuation-in-part
(Continued)

(51) Int. Cl.
| H01L 23/00 | (2006.01) |
| H01L 23/16 | (2006.01) |
| H01L 23/31 | (2006.01) |
| H01L 23/367 | (2006.01) |

(Continued)

(52) U.S. Cl.
CPC ............ *H01L 23/562* (2013.01); *H01L 23/16* (2013.01); *H01L 23/3185* (2013.01); *H01L 23/3675* (2013.01); *H01L 23/5383* (2013.01); *H01L 23/5385* (2013.01); *H01L 23/5386* (2013.01); *H01L 24/16* (2013.01); *H01L 25/0655* (2013.01); *H01L 2224/16235* (2013.01); *H01L 2924/19105* (2013.01);
(Continued)

(58) Field of Classification Search
None
See application file for complete search history.

(56) References Cited

U.S. PATENT DOCUMENTS

| 5,841,194 A | 11/1998 | Tsukamoto |
| 6,020,221 A | 2/2000 | Lim et al. |

(Continued)

FOREIGN PATENT DOCUMENTS

| CN | 1163480 A | 10/1997 |
| CN | 102110660 A | 6/2011 |

(Continued)

OTHER PUBLICATIONS

Chinese Language Office Action dated Jan. 13, 2021 for Taiwanese Application No. 109120165.
(Continued)

*Primary Examiner* — Long Pham
(74) *Attorney, Agent, or Firm* — Wolf, Greenfield & Sacks, P.C.

(57) ABSTRACT

A semiconductor package structure is provided. The semiconductor package structure includes a substrate, a frame, a redistribution layer, and a first semiconductor die. The substrate has a wiring structure and is surrounded by a molding material. The frame is disposed in the molding material and surrounds the substrate. The redistribution layer is disposed over the substrate and electrically coupled to the wiring structure. The first semiconductor die is disposed over the redistribution layer.

11 Claims, 17 Drawing Sheets

Related U.S. Application Data of application No. 15/906,098, filed on Feb. 27, 2018, now Pat. No. 10,784,211.

(60) Provisional application No. 62/818,174, filed on Mar. 14, 2019, provisional application No. 62/862,200, filed on Jun. 17, 2019, provisional application No. 62/470,915, filed on Mar. 14, 2017.

(51) Int. Cl.
 *H01L 23/538* (2006.01)
 *H01L 25/065* (2023.01)

(52) U.S. Cl.
 CPC ............... *H01L 2924/19106* (2013.01); *H01L 2924/3511* (2013.01); *H01L 2924/3512* (2013.01)

(56) References Cited

U.S. PATENT DOCUMENTS

| | | | |
|---|---|---|---|
| 6,313,521 B1 * | 11/2001 | Baba | H01L 23/10 257/659 |
| 8,247,900 B2 | 8/2012 | Yuan | |
| 8,710,629 B2 | 4/2014 | Bai et al. | |
| 9,209,048 B2 | 12/2015 | Huang et al. | |
| 9,412,662 B2 | 8/2016 | Lin et al. | |
| 9,425,171 B1 | 8/2016 | Minacapelli et al. | |
| 9,543,249 B1 | 1/2017 | Hu | |
| 10,529,645 B2 | 1/2020 | Gandhi et al. | |
| 10,784,211 B2 | 9/2020 | Lin et al. | |
| 11,037,887 B2 | 6/2021 | Chen | |
| 11,362,044 B2 | 6/2022 | Lin et al. | |
| 11,387,176 B2 | 7/2022 | Lin et al. | |
| 11,410,936 B2 | 8/2022 | Lin et al. | |
| 2001/0017408 A1 | 8/2001 | Baba | |
| 2002/0011907 A1 * | 1/2002 | Yamada | H01L 23/5385 333/204 |
| 2004/0150118 A1 | 8/2004 | Honda | |
| 2005/0186769 A1 | 8/2005 | Young | |
| 2007/0001278 A1 | 1/2007 | Jeon et al. | |
| 2007/0069366 A1 | 3/2007 | Chang et al. | |
| 2007/0194464 A1 | 8/2007 | Fukuzono | |
| 2008/0054490 A1 | 3/2008 | McLellan et al. | |
| 2008/0179725 A1 | 7/2008 | Chia et al. | |
| 2008/0237840 A1 | 10/2008 | Alcoe et al. | |
| 2008/0258293 A1 | 10/2008 | Yang et al. | |
| 2009/0141464 A1 | 6/2009 | Taguchi et al. | |
| 2009/0236730 A1 | 9/2009 | Topacio et al. | |
| 2010/0276799 A1 | 11/2010 | Heng et al. | |
| 2011/0156235 A1 | 6/2011 | Yuan | |
| 2012/0018871 A1 * | 1/2012 | Lee | H01L 25/0655 257/E23.194 |
| 2012/0182694 A1 | 7/2012 | Lin et al. | |
| 2012/0188721 A1 | 7/2012 | Ho et al. | |
| 2013/0234304 A1 | 9/2013 | Tamaki | |
| 2014/0070423 A1 | 3/2014 | Woychik et al. | |
| 2014/0131877 A1 | 5/2014 | Chen | |
| 2015/0187737 A1 | 7/2015 | Lin et al. | |
| 2015/0260929 A1 | 9/2015 | Matsumaru et al. | |
| 2016/0351467 A1 | 12/2016 | Li | |
| 2017/0018510 A1 | 1/2017 | Shen et al. | |
| 2018/0138127 A1 | 5/2018 | Lee et al. | |
| 2018/0138132 A1 | 5/2018 | Nishizawa et al. | |
| 2018/0175001 A1 | 6/2018 | Pyo et al. | |
| 2018/0204807 A1 | 7/2018 | Aizawa | |
| 2018/0269164 A1 | 9/2018 | Lin et al. | |
| 2018/0350772 A1 | 12/2018 | Nair et al. | |
| 2018/0374820 A1 | 12/2018 | Ko et al. | |
| 2019/0115269 A1 | 4/2019 | Pan et al. | |
| 2020/0211944 A1 | 7/2020 | Lin et al. | |
| 2020/0273812 A1 | 8/2020 | Lin et al. | |
| 2022/0336374 A1 | 10/2022 | Lin et al. | |

FOREIGN PATENT DOCUMENTS

| | | |
|---|---|---|
| CN | 201936868 U | 8/2011 |
| CN | 103038877 A | 4/2013 |
| CN | 103066029 A | 4/2013 |
| CN | 203192781 U | 9/2013 |
| CN | 103811429 A | 5/2014 |
| CN | 203659838 U | 6/2014 |
| CN | 104409366 A | 3/2015 |
| CN | 104471708 A | 3/2015 |
| CN | 104752372 A | 7/2015 |
| CN | 105719976 A | 6/2016 |
| CN | 106158819 A | 11/2016 |
| CN | 108630615 A | 10/2018 |
| CN | 111696979 A | 9/2020 |
| DE | 198 30 158 A1 | 4/1999 |
| DE | 10 2013 200518 A1 | 7/2013 |
| EP | 0 797 253 A2 | 9/1997 |
| EP | 1 983 158 A1 | 10/2008 |
| EP | 2 066 160 A2 | 6/2009 |
| EP | 3 376 535 A1 | 9/2018 |
| JP | 2003-017625 A | 1/2003 |
| JP | 2004-247464 A | 9/2004 |
| KR | 10-2008-0093909 A | 10/2008 |
| KR | 20090097425 A | 9/2009 |
| TW | 201546954 A | 12/2015 |
| TW | 201608653 A | 3/2016 |
| TW | 201705414 A | 2/2017 |
| TW | M563659 U | 7/2018 |
| TW | 201834164 A | 9/2018 |
| TW | M572570 U | 1/2019 |
| WO | WO 2013/119309 A1 | 8/2013 |

OTHER PUBLICATIONS

Chinese Language Office Action dated Mar. 31, 2021 for Taiwanese Application No. 108145283.
Chinese Language Office Action dated Sep. 14, 2021 for Taiwanese Application No. 108145283.
Chinese Language Office Action dated Jun. 2, 2021 for Chinese Application No. 201911261556.5.
Chinese Language Office Action dated May 7, 2020 for Chinese Application No. 201810189557.2.
Chinese Language Office Action dated Jun. 19, 2020 for Taiwanese Application No. 109108155.
Extended European Search Report dated Nov. 13, 2020 for European Application No. 20178978.1.
Extended European Search Report dated May 6, 2020 for European Application No. 19213567.1.
Extended European Search Report dated May 27, 2020 for European Application No. 20162559.7.
Extended European Search Report dated Jan. 24, 2020 for European Application No. 19196606.8.
Non-Final Office Action dated Oct. 21, 2020 for U.S. Appl. No. 16/563,919.

* cited by examiner

SEMICONDUCTOR PACKAGE STRUCTURE

CROSS REFERENCE TO RELATED APPLICATIONS

This application is a Division of application Ser. No. 15/930,645, filed on May 13, 2020, which is a Continuation-In-Part of application Ser. No. 16/813,898, filed on Mar. 10, 2020, which claims the benefit of U.S. Provisional Application No. 62/818,174 filed on Mar. 14, 2019, and is a Continuation-In-Part of application Ser. No. 15/906,098, filed on Feb. 27, 2018, which claims the benefit of Provisional Application No. 62/470,915, filed on Mar. 14, 2017. This application also claims the benefit of U.S. Provisional Application No. 62/862,200 filed on Jun. 17, 2019, the entirety of which is incorporated by reference herein.

BACKGROUND OF THE INVENTION

Field of the Invention

The present invention relates to a semiconductor package structure, and in particular to a semiconductor package structure with substrate partitions.

Description of the Related Art

A semiconductor package can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

However, a problem with such a semiconductor package is that it is subject to different temperatures during the packaging process. The semiconductor package may be highly stressed due to the different coefficients of thermal expansion (CTEs) of the various substrate and semiconductor die materials. As a result, the semiconductor package may exhibit warping or cracking so that the electrical connection between the semiconductor die and the substrate may be damaged, and the reliability of the semiconductor package may be decreased.

This problem is exacerbated in the case of a relatively large package, for example a package of 50 mm×50 mm or larger. Therefore, a novel semiconductor package structure is desirable.

BRIEF SUMMARY OF THE INVENTION

Semiconductor package structures are provided. An exemplary embodiment of a semiconductor package structure includes a substrate, a frame, a redistribution layer, and a first semiconductor die. The substrate has a wiring structure and is surrounded by a molding material. The frame is disposed in the molding material and surrounds the substrate. The redistribution layer is disposed over the substrate and electrically coupled to the wiring structure. The first semiconductor die is disposed over the redistribution layer.

Another exemplary embodiment of a semiconductor package structure includes a plurality of substrates, a frame, a redistribution layer, and a semiconductor die. The substrates are arranged side-by-side and have a plurality of wiring structures, wherein the substrates are surrounded by a molding material. The frame is disposed in the molding material and surrounds the substrates. The redistribution layer is disposed over the substrates and electrically coupled to the wiring structures. The semiconductor die is disposed over the redistribution layer.

Yet another exemplary embodiment of a semiconductor package structure includes a plurality of substrates, a frame, a redistribution layer, a plurality of semiconductor dies, an electronic component, and a heat spreader. The substrates are arranged side-by-side and have a plurality of wiring structures, wherein the substrates are surrounded by a molding material. The frame is disposed in the molding material and surrounds the substrates. The redistribution layer is disposed over the substrates and electrically coupled to the wiring structures. The semiconductor dies are disposed over the redistribution layer and arranged side-by-side. The electronic component is disposed on the substrates or the redistribution layer. The heat spreader is disposed over the frame.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1A is a cross-sectional view of the semiconductor package structure along line I-I' of FIG. 1C;

DETAILED DESCRIPTION OF THE INVENTION

Figure 1A:
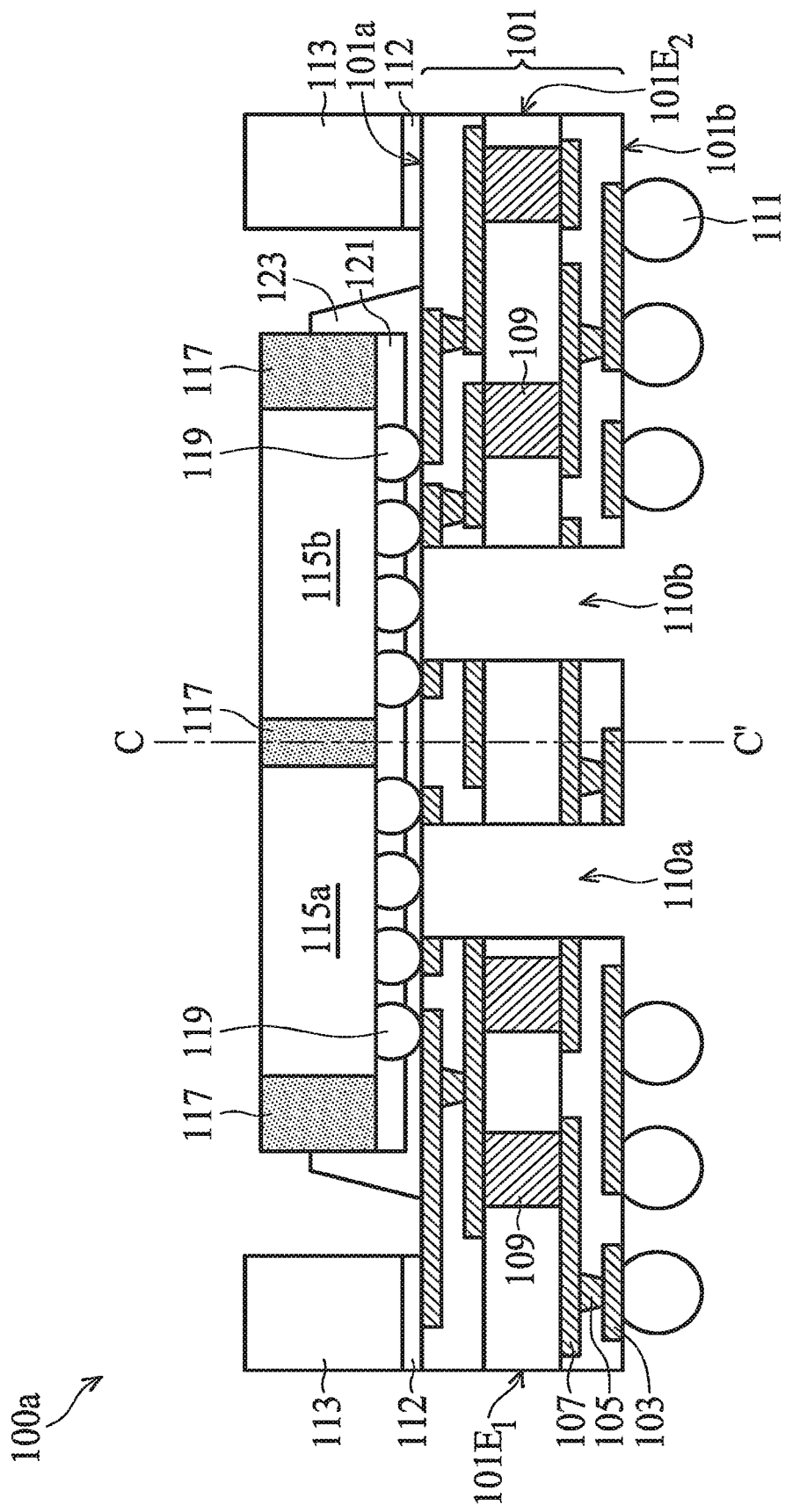
FIG. 1A is a cross-sectional view of a semiconductor package structure, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention is described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a cross-sectional view of a semiconductor package structure 100a, in accordance with some embodiments of the disclosure. FIG. 1C is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C.

Additional features can be added to the semiconductor package structure 100a. Some of the features described below can be replaced or eliminated for different embodiments. To simplify the diagram, only a portion of the semiconductor package structure 100a is depicted in FIGS. 1A and 1C. In some embodiments, the semiconductor package structure 100a may include a wafer-level semiconductor package, such as a flip-chip semiconductor package.

Referring to FIG. 1A, the semiconductor package structure 100a may be mounted on a base (not shown). In some embodiments, the semiconductor package structure 100a may be a system-on-chip (SOC) package structure. Moreover, the base may include a printed circuit board (PCB) and may be formed of polypropylene (PP). In some embodiments, the base may include a package substrate. The semiconductor package structure 100a is mounted on the base by a bonding process. For example, the semiconductor package structure 100a may include bump structures 111. In some embodiments, the bump structures 111 may be conductive ball structures (such as ball grid array (BGA)), conductive pillar structures, or conductive paste structures that are mounted on and electrically coupled to the base in the bonding process.

In the embodiment, the semiconductor package structure 100a includes a substrate 101. The substrate 101 has a wiring structure therein. In some embodiments, the wiring structure in the substrate 101 is a fan-out structure, and may include one or more conductive pads 103, conductive vias 105, conductive layers 107 and conductive pillars 109. In such cases, the wiring structure in the substrate 101 may be disposed in one or more inter-metal dielectric (IMD) layers. In some embodiments, the IMD layers may be formed of organic materials, which include a polymer base material, non-organic materials, which include silicon nitride (SiNx), silicon oxide (SiOx), grapheme, or the like. For example, the IMD layers are made of a polymer base material. It should be noted that the number and configuration of the IMD layers, the conductive pads 103, the conductive vias 105, the conductive layers 107 and the conductive pillars 109 shown in the figures and only some examples and are not limitations to the present invention.

Moreover, the semiconductor package structure 100a also includes a first semiconductor die 115a and a second semiconductor die 115b bonded onto the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base. The conductive structures 119 are disposed over the first surface 101a and below the first semiconductor die 115a and the second semiconductor die 115b, and the bump structures 111 are disposed over the second surface 101b of the substrate 101.

In some embodiments, the first semiconductor die 115a and the second semiconductor die 115b are electrically coupled to the bump structures 111 through the conductive structures 119 and the wiring structure in the substrate 101. In addition, the conductive structures 119 may be controlled collapse chip connection (C4) structures. It should be noted that the number of semiconductor dies integrated in the semiconductor package structure 100a is not limited to that disclosed in the embodiment.

In some embodiments, the first semiconductor die 115a and the second semiconductor die 115b are active devices. For example, the first semiconductor die 115a and the second semiconductor die 115b may be logic dies including a central processing unit (CPU), a graphics processing unit (GPU), a dynamic random access memory (DRAM) controller or any combination thereof. In some other embodiments, one or more passive devices are also bonded onto the substrate 101.

The first semiconductor die 115a and the second semiconductor dies 115b are arranged side-by-side. In some embodiments, the first semiconductor die 115a and the second semiconductor dies 115b are separated by a molding material 117. The molding material 117 surrounds the first semiconductor die 115a and the second semiconductor die 115b, and adjoins the sidewalls of the first semiconductor die 115a and the second semiconductor die 115b. In some embodiments, the molding material 117 includes a nonconductive material such as an epoxy, a resin, a moldable polymer, or another suitable molding material. In some embodiments, the molding material 117 is applied as a substantial liquid, and then is cured through a chemical reaction. In some other embodiments, the molding material 117 is an ultraviolet (UV) or thermally cured polymer applied as a gel or malleable solid, and then is cured through a UV or thermal curing process. The molding material 117 may be cured with a mold (not shown).

In some embodiments, the surfaces of the first semiconductor die 115a and the second semiconductor dies 115b facing away from the first surface 101a of the substrate 101 are exposed by the molding material 117, such that a heat dissipating device (not shown) can directly attached to the surfaces of the first semiconductor die 115a and the second semiconductor dies 115b. As a result, the heat-dissipation efficiency of the semiconductor package structure 100a can be improved, particularly for a large semiconductor package structure, such as 50 mm×50 mm, which is preferred for high-power applications.

The semiconductor package structure 100a also includes a polymer material 121 disposed under the molding material 117, the first semiconductor die 115a and the second semiconductor die 115b, and between the conductive structures 119. The semiconductor package structure 100a further includes an underfill layer 123 interposed between the first surface 101a of the substrate 101 and the polymer material 121. In some embodiments, the first semiconductor die 115a, the second semiconductor dies 115b and the molding material 117 are surrounded by the underfill layer 123. The polymer material 121 and the underfill layer 123 are disposed to compensate for differing coefficients of thermal expansion (CTEs) between the substrate 101, the conductive structures 119, the first semiconductor die 115a and the second semiconductor dies 115b.

In addition, the semiconductor package structure 100a includes a frame 113 attached to the first surface 101a of the substrate 101 through an adhesive layer 112. The first semiconductor die 115a and the second semiconductor die 115b are surrounded by the frame 113 and the adhesive layer 112. In some embodiments, the frame 113 and the adhesive layer 112 are separated from the underfill layer 123 by a gap. The substrate 101 has a first edge 101E1 and a second edge 101E2 opposite thereto. In some embodiments, the first edge 101 E1 and the second edge 101E2 are coplanar with sidewalls of the frame 113 and the adhesive layer 112.

Still referring to FIG. 1A, the substrate 101 of the semiconductor package structure 100a includes a first hole 110a and a second hole 110b formed on the second surface 101b. In some embodiments, at least one of the first hole 110a and the second hole 110b penetrates through the substrate 101 from the first surface 101a to the second surface 101b. Although the first hole 110a and the second hole 110b shown in FIG. 1A penetrate through the substrate 101, in some other embodiments, both the first hole 110a and the second hole 110b do not penetrate through the substrate 101 from the first surface 101a to the second surface 101b. In some embodiments, the first hole 110a is covered by the first semiconductor die 115a, and the second hole 110b is covered by the second semiconductor die 115b. In other words, the first hole 110a is located within the projection of the first semiconductor die 115a on the substrate 101, and the second hole 110b is located within the projection of the second semiconductor die 115b on the substrate 101.

Specifically, the first semiconductor die 115a and the second semiconductor die 115b have a center line C-C' between them. The first hole 110a is disposed closer to the center line C-C' than the first edge 101E1 of the substrate 101, and the second hole 110b is disposed closer to the center line C-C' than the second edge 101E2 of the substrate 101. Although there are only two holes in the substrate 101 shown in FIG. 1A, it should be noted that there is no limitation on the number of the holes formed in the substrate 101.

In some embodiments, the first hole 110a and the second hole 110b are formed by a laser drilling process or another suitable process. It should be noted that the first hole 110a and the second hole 110b may be formed by the same forming process for the conductive pillars 109 in the wiring structure of the substrate 101. Moreover, the first semiconductor die 115a and the second semiconductor die 115b are bonded to the substrate 101 after forming the holes in the substrate 101. Therefore, the damage of the first semiconductor die 115a and the second semiconductor die 115b can be prevented.

Referring to FIG. 1C, which is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C. It should be noted that FIG. 1C is the plan view from the bottom of the semiconductor package structure 100a. In other words, FIG. 1C is the plan view from the second surface 101b of the substrate 101, which the bump structures 111 are disposed on. In particular, the bump structures 111 are omitted for brevity.

As shown in FIG. 1C, the substrate 101 includes more than two holes. In particular, the substrate 101 further includes a third hole 110c and the fourth hole 110d formed on the second surface 101b. The third hole 110c is covered by the first semiconductor die 115a, and the fourth hole 110d is covered by the second semiconductor die 115b. It should be noted that the substrate 101 has a center 101C, and the first hole 101a, the second hole 101b, the third hole 110c, and the fourth hole 110d are disposed closer to the center 101C than the first edge 101E1 and the second edge 101E2 of the substrate 101.

The holes formed in the substrate 101, such as the first hole 110a, the second hole 110b, the third hole 110c and the fourth hole 110d, are designed to release the stress in the substrate 101, especially the stress concentrated in the region below the interface between two semiconductor dies (i.e. the first semiconductor die 115a and the second semiconductor die 115b). Since the semiconductor package structure 100a may be highly stressed due to the different coefficients of thermal expansion (CTEs) of the substrate 101 and the semiconductor dies, the holes formed in the substrate 101 can solve the warping or cracking problems caused by mismatched CTEs. As a result, the electrical connection within the semiconductor package structure 100a may not be damaged, and the reliability of the semiconductor package structure 100a may be increased.

Figure 1B:
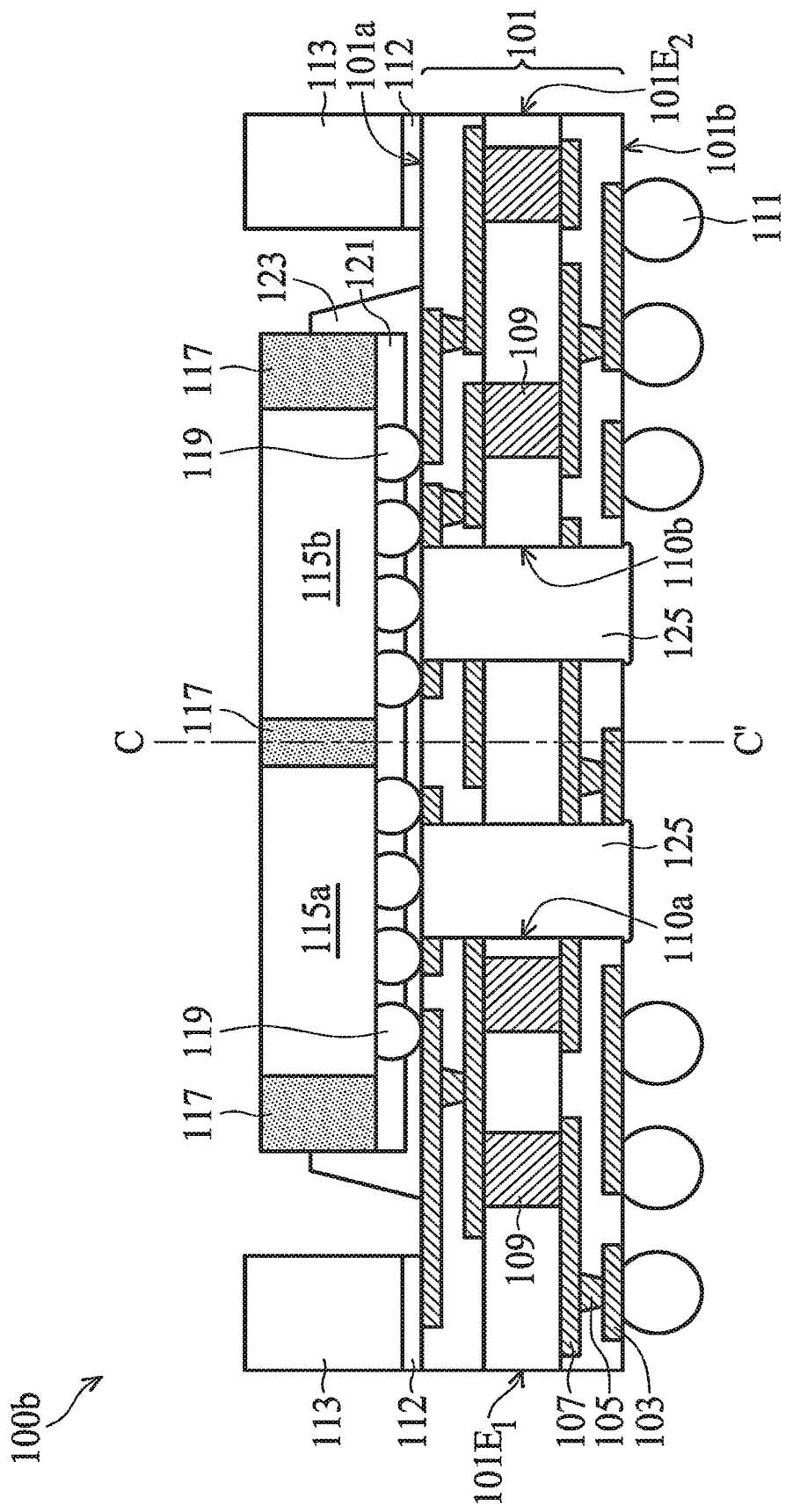
FIG. 1B is a cross-sectional view of a semiconductor package structure, in accordance with some other embodiments of the disclosure.
Figure 1C:
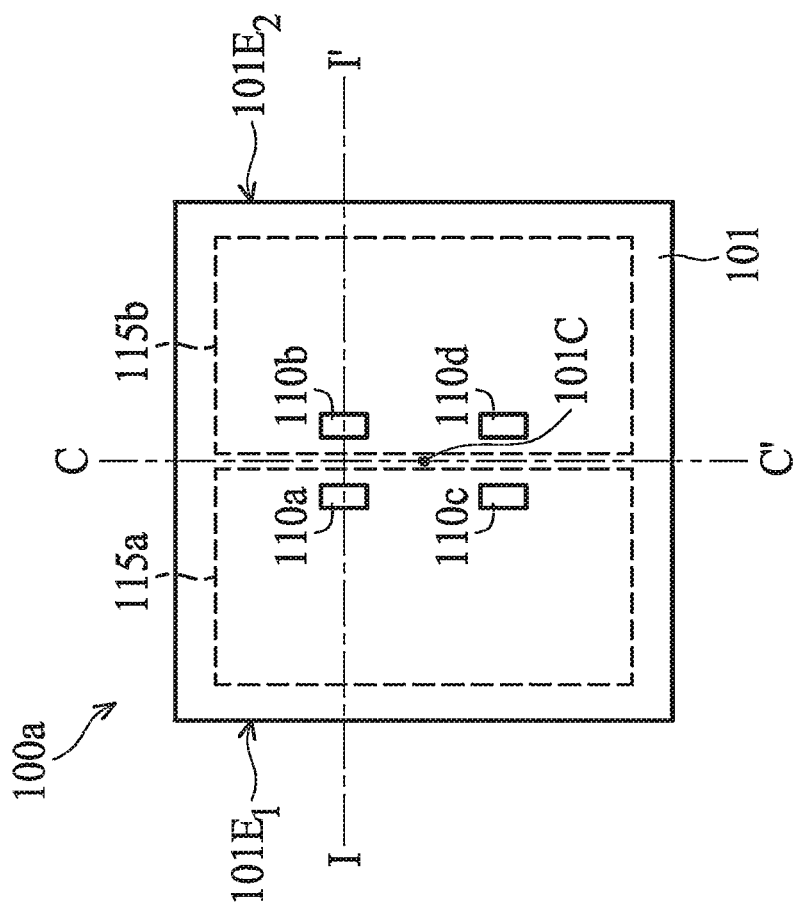
FIG. 1C is a plan view of an arrangement of holes in a substrate of the semiconductor package structure shown in FIG. 1A.

FIG. 1B is a cross-sectional view of a semiconductor package structure 100b, in accordance with some other embodiments of the disclosure. Descriptions of elements of the embodiments hereinafter that are the same as or similar to those previously described with reference to FIG. 1A are omitted for brevity.

As shown in FIG. 1B, the semiconductor package structure 100b includes a stress buffer layer 125 filled in the first hole 110a and the second hole 110b. The stress buffer layer 125 is made of a polymer material, such as a silicone resin or rubber. In some embodiments, the stress buffer layer 125 is made of an organic resin, such as Ajinomoto Build-up Film (ABF).

Moreover, the stress buffer layer 125 may be formed by a spin coating process. In some other embodiments, a material of the stress buffer layer 125 may be dispensed in the first hole 110a and the second hole 110b, and an excess portion of the material of the stress buffer layer 125 may be removed. In some embodiments, the stress buffer layer 125 may be formed before bonding the first semiconductor die 115a and the second semiconductor die 115b to the substrate 101.

In some embodiments, the stress buffer layer 125 may fill the first hole 110a and the second hole 110b, and the surfaces of the stress buffer layer 125 are level with the second surface 101b of the substrate 101. In some other embodiments, the surfaces of the stress buffer layer 125 may not be level with the second surface 101b of the substrate 101 according to the actual manufacturing processes.

Filling the first hole 110a and the second hole 110b with the stress buffer layer 125 may offer advantages like preventing the impurities and dusts from dropping into the first hole 110a and the second hole 110b during the handling process of the substrate 101. In addition, the warping or cracking problems caused by mismatched coefficients of thermal expansion in the semiconductor package structure 100b can be solved by the holes (including the first hole 110a and the second hole 110b) and the stress buffer layer 125 formed in the substrate 101. Accordingly, the electrical connection within the semiconductor package structure 100b may not be damaged, and the lifespan of the semiconductor package structure 100b may be increased.

Figure 2B:
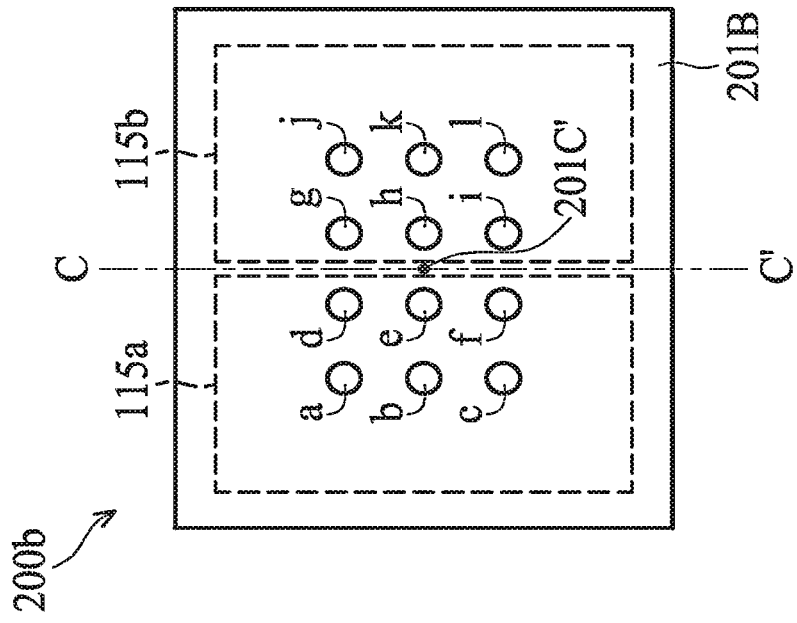
FIGS. 2A-2B are plan views showing the shapes of the holes in the substrates of semiconductor package structures, in accordance with some embodiments of the disclosure.
Figure 2A:
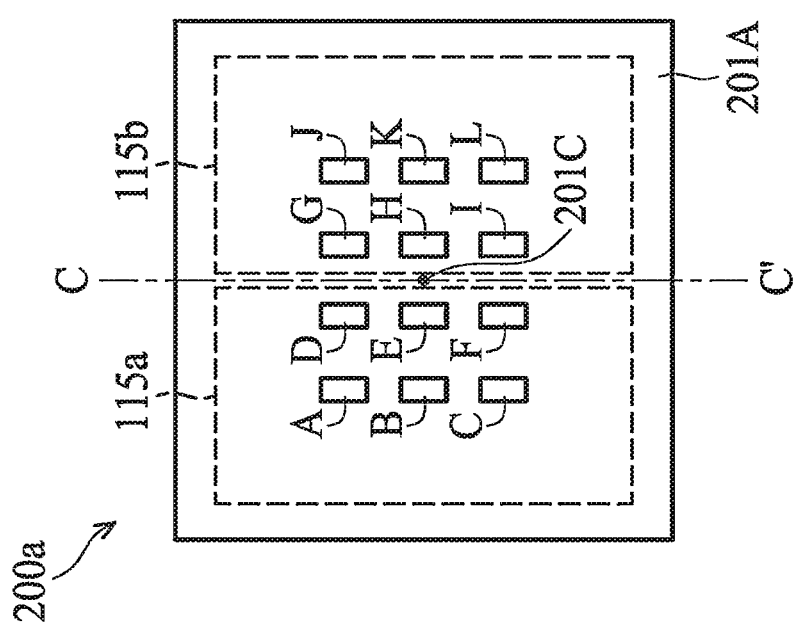

FIG. 2A is a plan view showing the shapes of the holes in a substrate 201A of a semiconductor package structure 200a, and FIG. 2B is a plan view showing the shapes of the holes in a substrate 201B of a semiconductor package structure 200b, in accordance with some embodiments of the disclosure. Descriptions of elements of the embodiments hereinafter that are the same as or similar to those previously described with reference to FIG. 1C are omitted for brevity.

Referring to FIG. 2A, the semiconductor package structure 200a has holes A, B, C, D, E, F, G, H, I, J, K and L in the substrate 201A, and the number of holes in the substrate 201A is much higher than that in the substrate 101 of the semiconductor package structure 100a. As shown in FIG. 2A, the holes A, B, C, D, E and F are covered by the first semiconductor die 115a, and the holes G, H, I, J, K and L are covered by the second semiconductor die 115b. In other words, the holes A-F are located within the projection of the first semiconductor die 115a on the substrate 201A, and the holes G-L are located within the projection of the second semiconductor die 115b on the substrate 201A.

Specifically, the holes A, B and C are arranged in a first array, the holes D, E and F are arranged in a second array, the holes G, H and I are arranged in a third array, and the holes J, K and L are arranged in a fourth array. The first array, the second array, the third array and the fourth array are parallel to the center line C-C' of the first semiconductor die 115a and the second semiconductor die 115b.

Referring to FIG. 2B, the substrate 201B in the semiconductor package structure 200b has holes a, b, c, d, e, f, g, h, i, j, k and 1, which are arranged in the same way as the holes A-L of the substrate 201A in the semiconductor package structure 200a. The difference between the substrate 201A and the substrate 201B is that the holes a-l have circular shapes in the plan view. Compared with the holes A-L in the substrate 201A, which have rectangular shapes in the plan view, the problems of stress concentrated at the corners of the holes A-L can be prevented in the substrate 201B due to the round shapes of the holes a-l. Therefore, there is a lower probability of the cracking problem occurring in the substrate 201B of the semiconductor package structure 200b.

In some embodiments, stress buffer layers may optionally be formed in the holes A-L of the semiconductor package structure 200a and in the holes a-l of the semiconductor package structure 200b. It should be noted that the holes A-L are symmetrically located about the center line C-C' in the plan view of FIG. 2A, and the holes a-l are symmetrically located about the center line C-C' in the plan view of FIG. 2B. In some other embodiments, the holes A-L are symmetrically located about the center 201C of the substrate 201A in the plan view of FIG. 2A, and the holes a-l are symmetrically located about the center 201C' of the substrate 201B in the plan view of FIG. 2B.

Figure 3B:
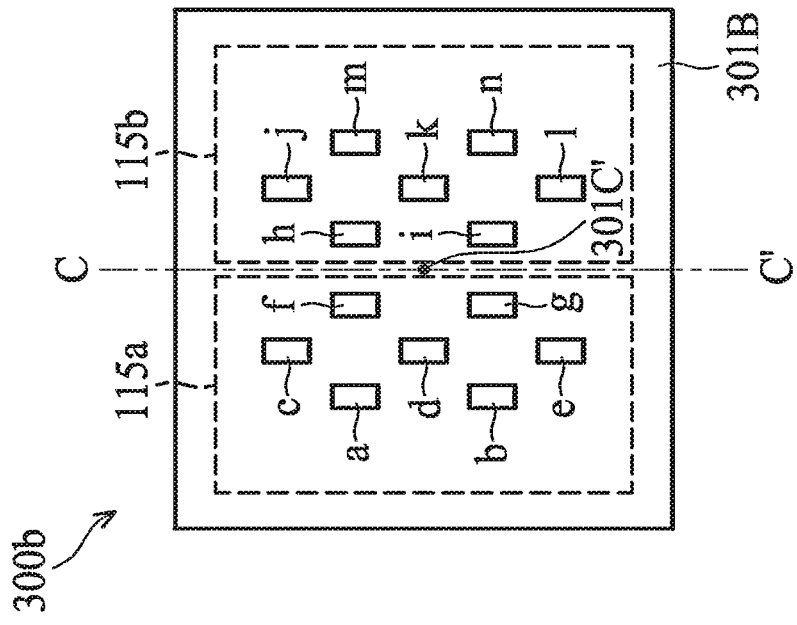
FIGS. 3A-3B are plan views showing arrangements of holes in substrate of semiconductor package structures, in accordance with some embodiments of the disclosure.
Figure 3A:
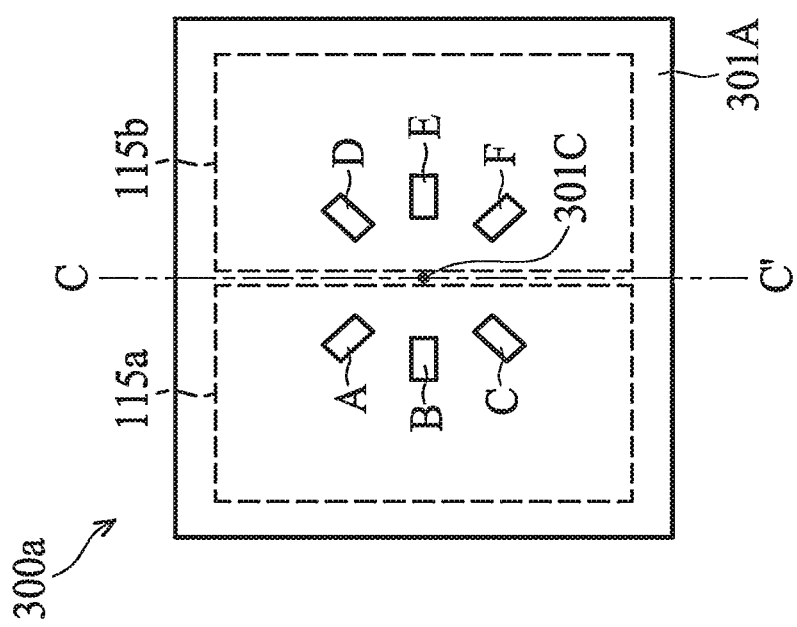

FIG. 3A is a plan view showing arrangements of holes in a substrate 301A of a semiconductor package structure 300a, and FIG. 3B is a plan view showing arrangements of holes in a substrate 301B of a semiconductor package structure 300b, in accordance with some embodiments of the disclosure. Descriptions of elements of the embodiments hereinafter that are the same as or similar to those previously described with reference to FIG. 2A are omitted for brevity.

Referring to FIG. 3A, the semiconductor package structure 300a has holes A, B, C, D, E, and F in the substrate 301A. The holes A, B and C are covered by the first semiconductor die 115a, and the holes D, E and F are covered by the second semiconductor die 115b. In other words, the holes A-C are located within the projection of the first semiconductor die 115a on the substrate 301A, and the holes D-F are located within the projection of the second semiconductor die 115b on the substrate 301A.

It should be noted that the holes A-F are arranged radially around the center 301C of the substrate 301A. In some other embodiments, the holes A-F are arranged radially around a center, and the center is located between the first semiconductor die 115a and the second semiconductor die 115b.

Compared with the semiconductor substrate 200a of FIG. 2A, the stress in the substrate 301A of the semiconductor package structure 300a, which has holes A-F arranged radially, can be released more efficiently. In other words, in order to obtain the same stress releasing effect as in the semiconductor package structure 200a, the number of the holes in the substrate 301A of the semiconductor package structure 300a can be less than the number of the holes in the substrate 201A of the semiconductor package structure 200a. However, the substrate 201A of the semiconductor package structure 200a, which has holes A-L arranged parallel to the center line C-C', is more easily to be manufactured than the substrate 301A of the semiconductor package structure 300a, which has holes A-F arranged radially.

Referring to FIG. 3B, the substrate 301B in the semiconductor package structure 300b has holes a, b, c, d, e, f, g, h, i, j, k, l, m and n arranged in a staggered arrangement in the substrate 301B. Specifically, the holes a-g are covered by the first semiconductor die 115a and staggered in the direction of the center line C-C', and the holes h-n are covered by the second semiconductor die 115b and staggered in the direction of the center line C-C'.

Compared with the semiconductor package structure 200a in FIG. 2A and the semiconductor package structure 300a in FIG. 3A, the substrate 301B of the semiconductor package structure 300b can combine the above-mentioned benefits of the hole arrangements of the substrate 201A in the semiconductor package structure 200a and the substrate 301A of the semiconductor package structure 300a. Specifically, the holes a-n in the substrate 301B can be manufactured easily, and the stress in the substrate 301B can be released efficiently.

In some embodiments, stress buffer layers may optionally be formed in the holes A-F of the semiconductor package structure 300a and the holes a-n of the semiconductor package structure 300b. It should be noted that the holes A-F are symmetrically located about the center line C-C' in the plan view of FIG. 3A, and the holes a-n are symmetrically located about the center line C-C' in the plan view of FIG. 3B. In some other embodiments, the holes A-F are symmetrically located about the center 301C of the substrate 301A in the plan view of FIG. 3A, and the holes a-n are symmetrically located about the center 301C' of the substrate 301B in the plan view of FIG. 3B.

Figure 4B:
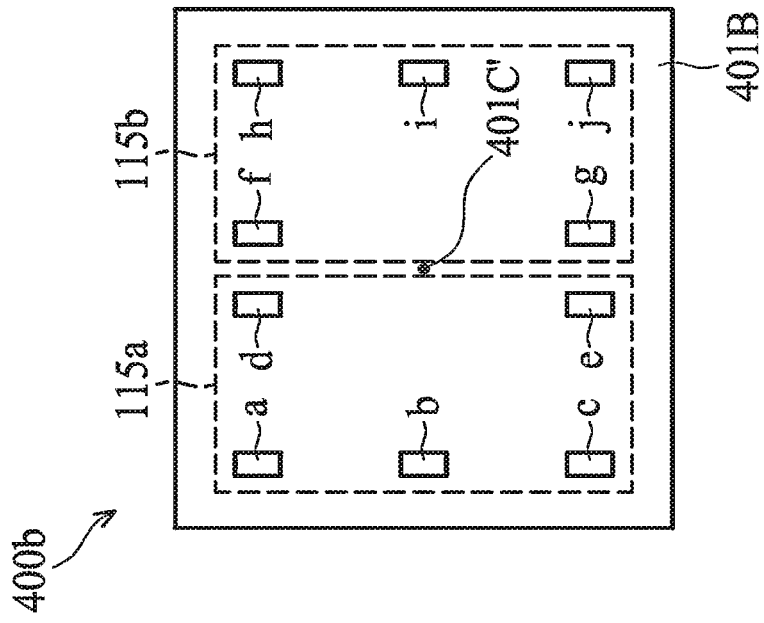
FIGS. 4A-4B are plan views showing locations of holes in substrates of semiconductor package structures, in accordance with some embodiments of the disclosure.
Figure 4A:
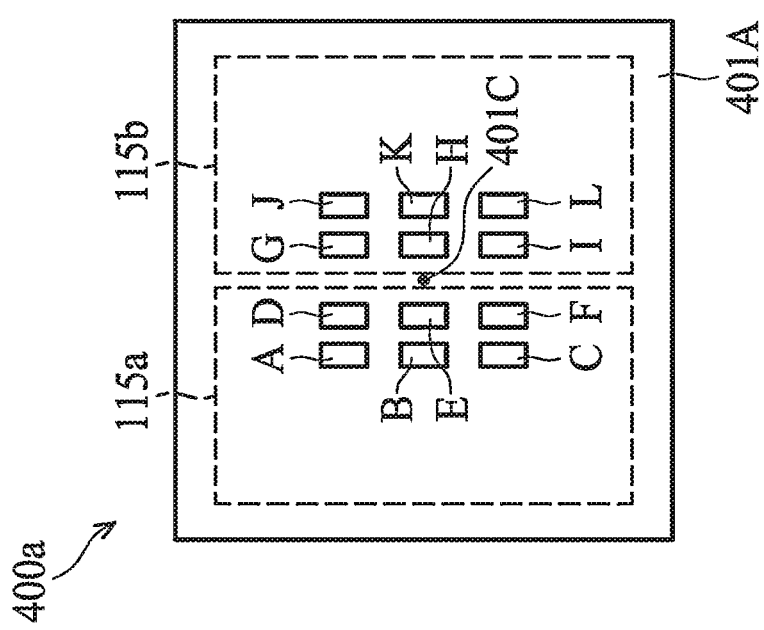

FIG. 4A is a plan view showing locations of holes in a substrate 401A of a semiconductor package structure 400a, and FIG. 4B is a plan view showing locations of holes in a substrate 401B of a semiconductor package structure 400b, in accordance with some embodiments of the disclosure. Descriptions of elements of the embodiments hereinafter that are the same as or similar to those previously described with reference to FIG. 2A are omitted for brevity.

Referring to FIG. 4A, the substrate 401A in the semiconductor package structure 400a has holes A, B, C, D, E, F, G, H, I, J, K and L arranged in the same way as the holes A-L of the substrate 201A in the semiconductor package structure 200a shown in FIG. 2A. The holes A-L are arranged parallel to the center line C-C' in the substrate 401A. The difference between FIGS. 2A and 4A is that the holes A-L in the substrate 401A are located closer to the center 401C of the substrate 401A than the holes A-L in the substrate 201A.

Since the maximum stress is likely to be concentrated at the center 401C of the substrate 401A, the stress in the substrate 401A of the semiconductor package structure 400a, which has holes A-L located closer to the center 401C of the substrate 401A, can be released more efficiently than the semiconductor package structure 200a.

Referring to FIG. 4B, the substrate 401B in the semiconductor package structure 400b has holes a, b, c, d, e, f, g, h, i and j located along the peripheral edge of the substrate 401B. In other words, the holes a-j are located far from the center 401C' of the substrate 401B to reserve space in the middle of the substrate 401B for routing. The semiconductor substrate 400b of FIG. 4B can provide a better routing capability for the substrate 401B than the semiconductor substrate 400a of FIG. 4A.

In some embodiments, stress buffer layers may optionally be formed in the holes A-L of the semiconductor package structure 400a and the holes a-j of the semiconductor package structure 400b. It should be noted that the holes A-L are symmetrically located about the center line C-C' in the plan view of FIG. 4A, and the holes a-j are symmetrically located about the center line C-C' in the plan view of FIG. 4B. In some other embodiments, the holes A-L are symmetrically located about the center 401C of the substrate 401A in the plan view of FIG. 4A, and the holes a-j are symmetrically located about the center 401C' of the substrate 401B in the plan view of FIG. 4B.

According to the foregoing embodiments, the holes formed in the substrate are designed to release the stress in the substrate, especially the stress concentrated in the region below the interface between two semiconductor dies. Since the semiconductor package structure may be highly stressed due to the different coefficients of thermal expansion (CTEs) of the substrate and the semiconductor dies, the holes formed in the substrate can solve the warping or cracking problems caused by mismatched CTEs. As a result, the electrical connection within the semiconductor package structure may remain undamaged, and the reliability and the lifespan of the semiconductor package structure may be increased.

Figure 5A:
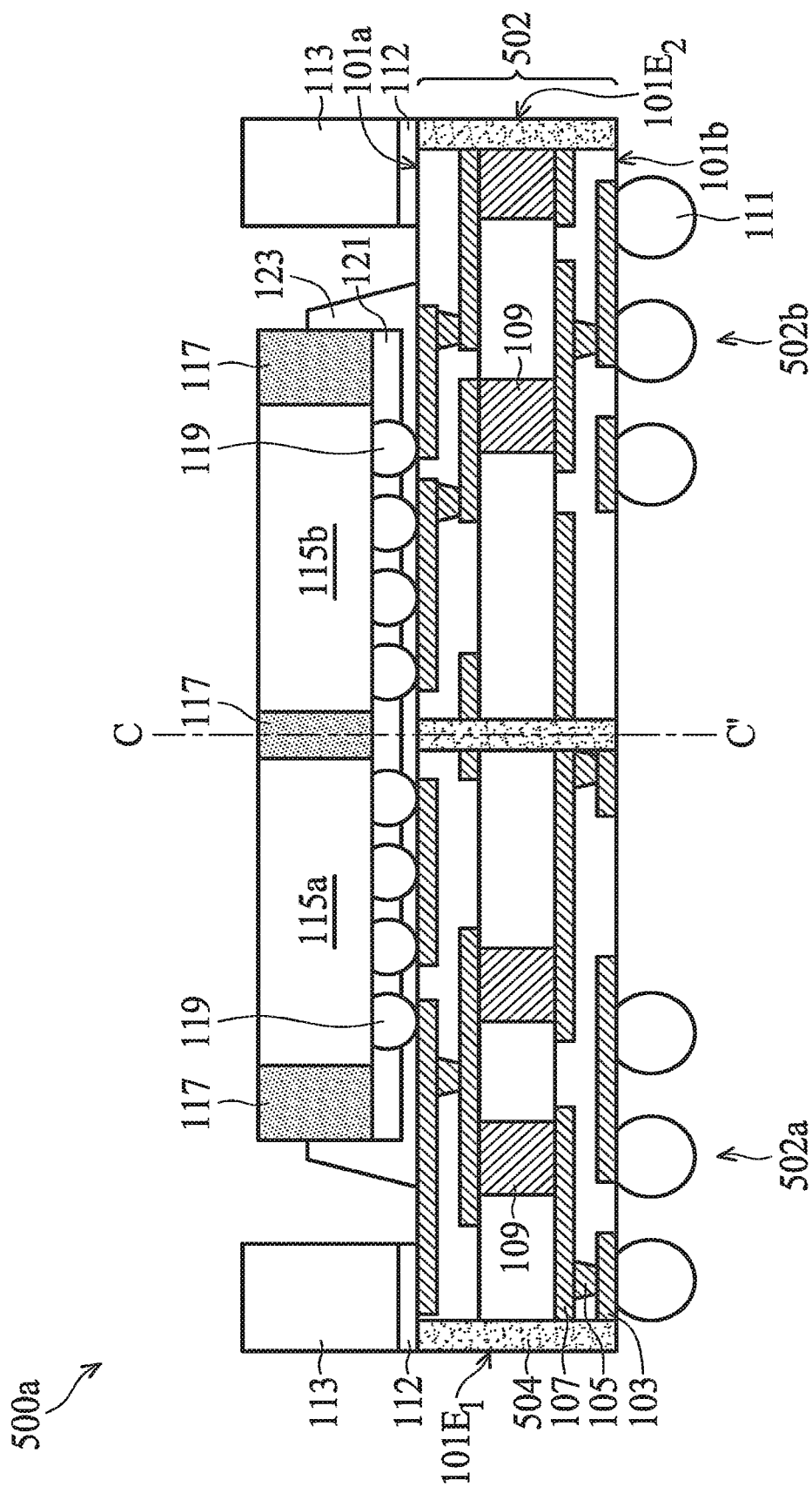
FIG. 5A-5B are cross-sectional views of semiconductor package structures, in accordance with some embodiments of the disclosure.

FIG. 5A is a cross-sectional view of a semiconductor package structure 500a, in accordance with some other embodiments of the disclosure. It should be noted that the semiconductor package structure 500a may include the same or similar components as that of the semiconductor package structures 100a and 100b, and for the sake of simplicity, those components will not be discussed in detail again. In comparison with the embodiment of FIGS. 1A-4B, the following embodiment provides a substrate 502 including a first substrate 502a and a second substrate 502b. By using a plurality of small substrates instead of a large substrate, the reliability of the semiconductor package structure can be further improved according to some embodiments of the present disclosure.

As shown in FIG. 5A, the first substrate 502a and the second substrate 502b are arranged side-by-side. The first substrate 502a has a first wiring structure therein, and the second substrate 502b has a second wiring structure therein. Each of the first substrate 502a and the second substrate 502b may be the same as or similar to the substrate 101 of the semiconductor package structures 100a and 100b.

The first substrate 502a and the second substrate 502b may be homogenous or heterogeneous. That is, the first substrate 502a and the second substrate 502b may be the same as, similar to, or different from each other. Each of the first wiring structure in the first substrate 502a and the second wiring structure in the second substrate 502b may be the same as or similar to the wiring structure in the substrate 101. The first wiring structure in the first substrate 502a may be the same as or different from the second wiring structure in the second substrate 502b. In some embodiments, each of the first wiring structure in the first substrate 502a and the second wiring structure in the second substrate 502b includes one or more conductive pads 103, conductive vias 105, conductive layers 107, and conductive pillars 109. The number of the conductive pads 103, the conductive vias 105, the conductive layers 107, and the conductive pillars 109 may be more or less in the first substrate 502a and the second substrate 502b than in the substrate 101.

The substrate 502 may be viewed as partitioned into the first substrate 502a and the second substrate 502b. Therefore, the first substrate 502a and the second substrate 502b may be also referred to as the first substrate partition 502a and the second substrate partition 502b. In order to improve performance of electronic devices, a greater number of semiconductor dies are bonded onto a larger substrate. However, some related issues also occur. For example, as the volume of the substrate increases, more defects may be introduced during fabricating. According to some embodiments of the present disclosure, where the substrate 502 includes two or more substrate partitions, smaller substrate partitions can also be used. Accordingly, the reliability and the design flexibility of the semiconductor package structure can be improved.

The substrate 502 further includes a molding material 504 surrounding the first substrate 502a and the second substrate 502b. The molding material 504 adjoins the sidewalls of the first substrate 502a and the second substrate 502b. The molding material 504 may be same as or similar to the molding material 117 of the semiconductor package structures 100a and 100b. The formation and the material of the molding material 504 may include the formation and the material as described above with respect to the molding material 117, and will not be repeated again. In some embodiments, the first substrate 502a and the second substrate 502b are separated by the molding material 504.

The semiconductor package structure 500a also includes a first semiconductor die 115a and a second semiconductor die 115b bonded onto the substrate 502 through a plurality of conductive structures 119. In some embodiments, the first semiconductor die 115a is disposed over the first substrate 502a and electrically coupled to the first wiring structure in the first substrate 502a, and the second semiconductor die 115b is disposed over the second substrate 502b and electrically coupled to the second wiring structure in the second substrate 502b.

In some embodiments, the conductive structures 119 are disposed between the substrate 502 and the first semiconductor die 115a and between the substrate 502 and the second semiconductor die 115b, and the bump structures 111 are disposed below the substrate 502. In some embodiments, the first semiconductor die 115a is electrically coupled to the bump structures 111 through the conductive structures 119 and the first wiring structure in the first substrate 502a, and the second semiconductor die 115b is electrically coupled to the bump structures 111 through the conductive structures 119 and the second wiring structure in the second substrate 502b.

Although the thickness of the first substrate 502a and the thickness of the second substrate 502b are substantially the same in Figures, the present disclosure is not limit thereto. In some embodiments, the thickness of the first substrate 502a and the thickness of the second substrate 502b are different. For example, the thickness of the first substrate 502a and the thickness of the second substrate 502b may depend on the characteristics of the semiconductor dies formed on them. In some embodiments, the semiconductor package structure 500a having substrates 502 with different thicknesses can be used for, for example, dual-band antenna applications.

In this case, the size of components adjacent to the first substrate 502a and/or the second substrate 502b may be adjusted to provide a planar surface. For example, in embodiments where the first substrate 502a is thicker than the second substrate 502b, the conductive structures 119 disposed between the second semiconductor die 115b and the second substrate 502b may be thicker than the conductive structures 119 disposed between the first semiconductor die 115a and the first substrate 502a to provide a planar surface for bonding the semiconductor dies 115a, 115b thereon.

In some embodiments, the first semiconductor die 115a and the second semiconductor die 115b are surrounded by the molding material 117. The first semiconductor die 115a and the second semiconductor die 115b may be separated by the molding material 117. In some embodiments, surfaces of the first semiconductor die 115a and the second semiconductor die 115b facing away from the substrate 502 are exposed by the molding material 117.

Still referring to FIG. 5A, the semiconductor package structure 500a includes a frame 113 disposed over the first substrate 502a and the second substrate 502b. The frame 113 may be attached to the substrate 502 through an adhesive layer 112. The first semiconductor die 115a and the second semiconductor die 115b may be surrounded by the frame 113. In some embodiments, the frame 113 is separated from the underfill layer 123 by a gap. The sidewalls of the frame 113 may be coplanar with the sidewalls of the molding material 504.

The frame 113 may include a metal ring or the inside of the frame 113 may include fluid. In embodiments where the frame 113 includes a metal ring, the structural strength of the semiconductor package structure can be reinforced. In embodiments where the inside of the frame 113 includes fluid, heat dissipation can be improved. The frame 113 is optional. In other embodiments, the semiconductor package structure does not include the frame 113.

Figure 5B:
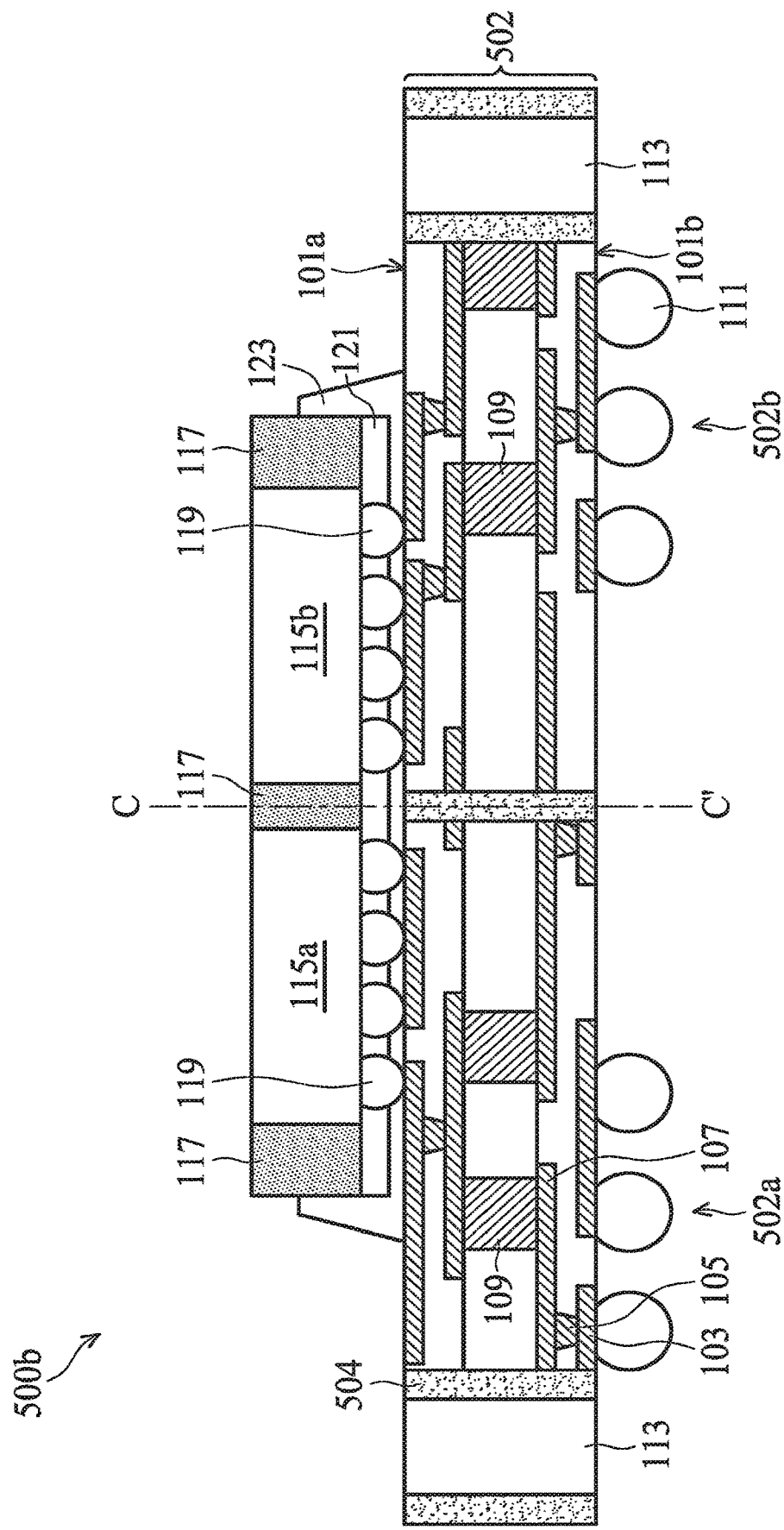

FIG. 5B is a cross-sectional view of a semiconductor package structure 500b, in accordance with some other embodiments of the disclosure. Descriptions of elements of the embodiments hereinafter that are the same as or similar to those previously described with reference to FIG. 5A are omitted for brevity.

As shown in FIG. 5B, the frame 113 is disposed on sidewalls of the substrate 502 and surrounds the first substrate 502a and the second substrate 502b. The frame 113 may be surrounded by the molding material 504. In some embodiments, the frame 113 is separated from the first substrate 502a and the second substrate 502b by the molding material 504. The top surface of the frame 113 may be coplanar with the top surface of the molding material 504, and the bottom surface of the frame 113 may be coplanar with the bottom surface of the molding material 504.

One of the methods to solve the warping or cracking problems caused by mismatched CTEs is to increase the thickness of the core layer of the substrate 502. However, this method may cause some problems, such as increased costs and complicated processing. The embodiment of the present disclosure providing the frame 113 disposed on sidewalls of the substrate 502 and surrounding the first substrate 502a and the second substrate 502b can increase the strength of the substrate 502, thereby reducing the thickness of the core layer of the substrate 502 and preventing the related issues.

Figure 6A:
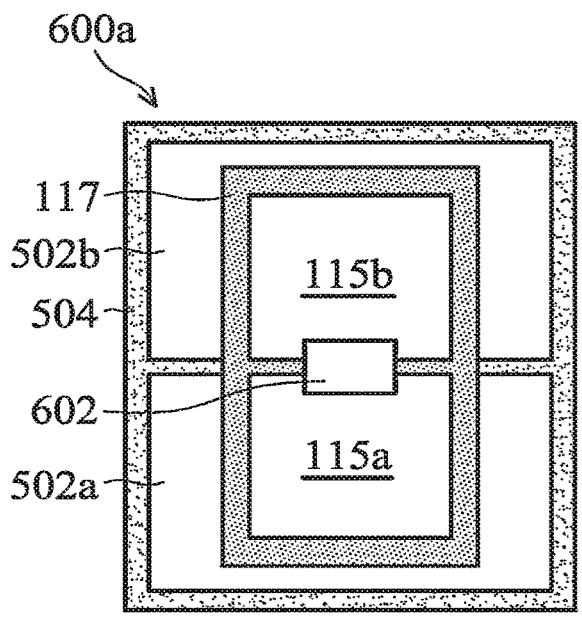
FIG. 6A-6C are plan views of semiconductor package structures, in accordance with some embodiments of the disclosure.
Figure 6B:
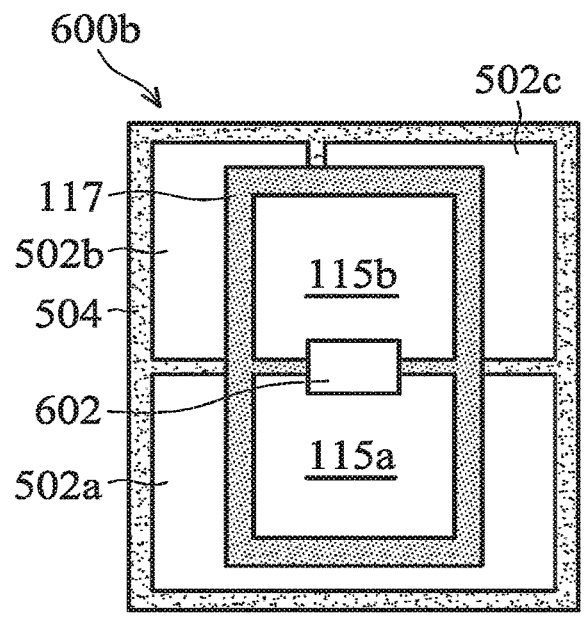
Figure 6C:
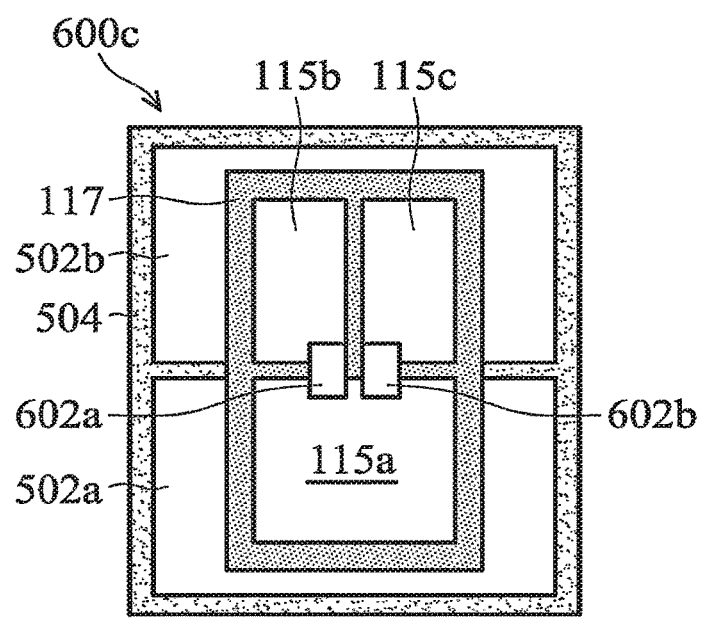

FIGS. 6A-6C are plan views of semiconductor package structures 600a, 600b and 600c, in accordance with some embodiments of the disclosure. For brevity, some components are omitted.

FIG. 6A may be the plan view from the top of the semiconductor package structure 500a in FIG. 5A or the top of the semiconductor package structure 500b in FIG. 5B. As shown in FIG. 6A, the semiconductor package structure 600a includes the first substrate 502a, the second substrate 502b, the first semiconductor die 115a over the first substrate 502a, and the second semiconductor die 115b over the second substrate 502b. The arrangement is merely example and is not intended to be limiting. For example, the first semiconductor die 115a may be disposed over the first substrate 502a and the second substrate 502b in some embodiments.

The first semiconductor die 115a and the second semiconductor die 115b may be electrically connected with each other through wires 602 from the top surfaces of the first semiconductor die 115a and the second semiconductor die 115b. Furthermore, in some embodiments, a portion of the molding material 504 is overlapped with a portion of the molding material 117 from the plan view.

In some embodiments of the present disclosure, the semiconductor package structure 600b includes more than two substrates. As shown in FIG. 6B, the semiconductor package structure 600b further includes a third substrate 502c. The first substrate 502a, the second substrate 502b, and the third substrate 502c may be surrounded by the molding material 504. In some embodiments, the first substrate 502a, the second substrate 502b and the third substrate 502c are separated by the molding material 504.

The third substrate 502c may have a third wiring structure. The third wiring structure in the third substrate 502c may be the same as or different from the first wiring structure in the first substrate 502a or the second wiring structure in the second substrate 502b. In some embodiments, the first semiconductor die 115a and/or the second semiconductor die 115b is also electrically coupled to the third wiring structure in the third substrate 502c. The first semiconductor die 115a and the second semiconductor die 115b may be electrically connected with each other through the wires 602 from the top surfaces of the first semiconductor die 115a and the second semiconductor die 115b.

As shown in FIG. 6B, the second semiconductor die 115b is disposed over the second substrate 502b and the third substrate 502c, wherein the third substrate 502c is disposed adjacent to the first substrate 502a and the second substrate 502b. The arrangement is merely example and is not intended to be limiting. For example, the third substrate 502c may be disposed adjacent to the first substrate 502a or the second substrate 502b only. Alternatively, the first semiconductor die 115a may be disposed over the first substrate 502a and the third substrate 502c.

In some embodiments of the present disclosure, the semiconductor package structure 600c includes more than two semiconductor dies. As shown in FIG. 6C, the semiconductor package structure 600c further includes a third semiconductor die 115c disposed over the second substrate 502b and electrically coupled to the second wiring structure in the second substrate 502b. The third semiconductor die 115c may be bonded onto the second substrate 502b through a plurality of conductive structures (not shown).

In some embodiments, the first semiconductor die 115a, the second semiconductor die 115b and the third semiconductor die 115c are surrounded by the molding material 117. In some embodiments, the first semiconductor die 115a, the second semiconductor die 115b and the third semiconductor die 115c are separated by the molding material 117. The third semiconductor die 115c may be the same as or different from the first semiconductor die 115a or the second semiconductor die 115b.

The first semiconductor die 115a and the second semiconductor die 115b may be electrically connected with each other through the wires 602a from the top surfaces of the first semiconductor die 115a and the second semiconductor die 115b, and the first semiconductor die 115a and the third semiconductor die 115c may be electrically connected with each other through the wires 602b from the top surfaces of the first semiconductor die 115a and the third semiconductor die 115c. The arrangement is merely example and is not intended to be limiting. For example, the second semiconductor die 115b and the third semiconductor die 115c may be electrically connected with each other through wires from the top surfaces of the second semiconductor die 115b and the third semiconductor die 115c.

As shown in FIG. 6C, the third semiconductor die 115c is disposed over the second substrate 502b, and the third substrate 502c is disposed adjacent to the first semiconductor die 115a and the second semiconductor die 115b. The arrangement is merely example and is not intended to be limiting. For example, the third substrate 502c may be disposed over the first substrate 502a or an additional substrate (not shown). It should be noted that the number of semiconductor dies and the number of substrates in the semiconductor package structures 600a-600c are not limited to that disclosed in the embodiment.

Figure 7:
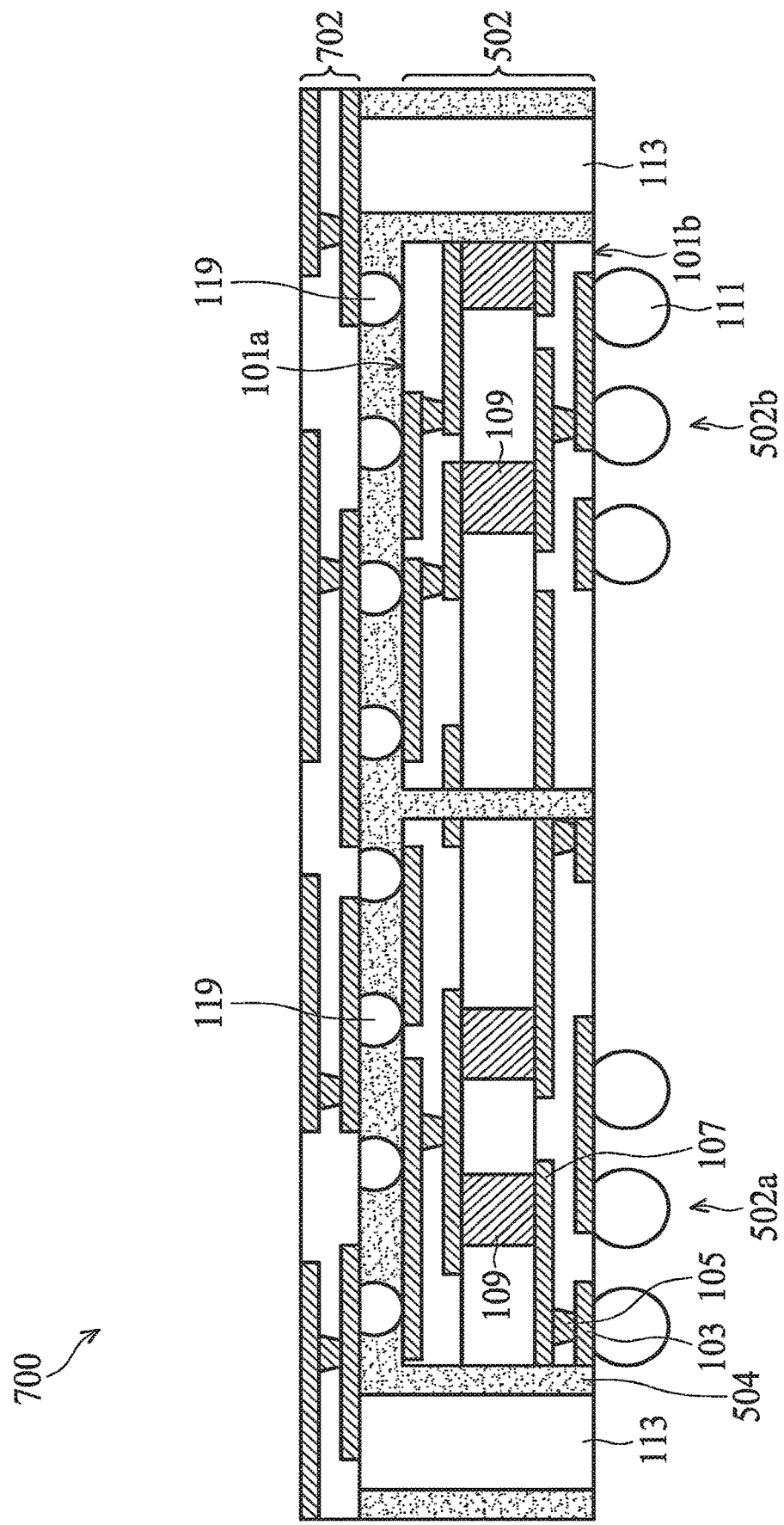
FIG. 7 is a cross-sectional view of a semiconductor package structure, in accordance with some embodiments of the disclosure.

FIG. 7 is a cross-sectional view of a semiconductor package structure 700, in accordance with some other embodiments of the disclosure. The semiconductor package structure 700 may include the same or similar components as that of the semiconductor package structures 500a and 500b, and for the sake of simplicity, those components will not be discussed in detail again.

As shown in FIG. 7, a redistribution layer 702 is disposed over the substrate 502. In some embodiments, the redistribution layer 702 includes one or more dielectric layers, wiring layers, or any other suitable structures. The redistribution layer 702 may cover the first substrate 502a and the second substrate 502b, and the redistribution layer 702 may be electrically coupled to the first wiring structure in the first substrate 502a and the second wiring structure in the second substrate 502b.

The redistribution layer 702 may be bonded onto the substrate 502 through a plurality of conductive structures 119. In some embodiments, the conductive structures 119 are disposed between the redistribution layer 702 and the first substrate 502a and between the redistribution layer 702 and the second substrate 502b. In some embodiments, the redistribution layer 702 is electrically coupled to the bump structures 111 through the conductive structures 119, the first wiring structure in the first substrate 502a, and the second wiring structure in the second substrate 502b.

As mentioned above, the size of components adjacent to the first substrate 502a and/or the second substrate 502b may be adjusted to provide a planar surface. In some embodiments, the first substrate 502a is thicker than the second substrate 502b, and the conductive structures 119 disposed between the redistribution layer 702 and the second substrate 502b may be thicker than the conductive structures 119 disposed between the redistribution layer 702 and the first substrate 502a to provide a planar surface for bonding the redistribution layer 702 thereon.

As shown in FIG. 7, the redistribution layer 702 covers the frame 113, and the frame 113 is thicker than the first substrate 502a and the second substrate 502b to support the redistribution layer 702. The sidewalls of the redistribution layer 702 may be coplanar with the sidewalls of the molding material 504. In other embodiments, the redistribution layer 702 exposes the frame 113 or partially covers the frame 113. In these embodiments, the frame 113 may surround the redistribution layer 702.

As mentioned above, the thickness of the substrate 502 can be reduced by disposing the frame 113 thereon. In some embodiments, a double-sided substrate fabricating process can be used for fabricating thin substrates. In particular, in the double-sided substrate fabricating process, interconnect structures are simultaneously formed on opposite surfaces of a carrier substrate, and then the interconnect structures are separated from the carrier substrate to form the thin substrates.

Figure 8:
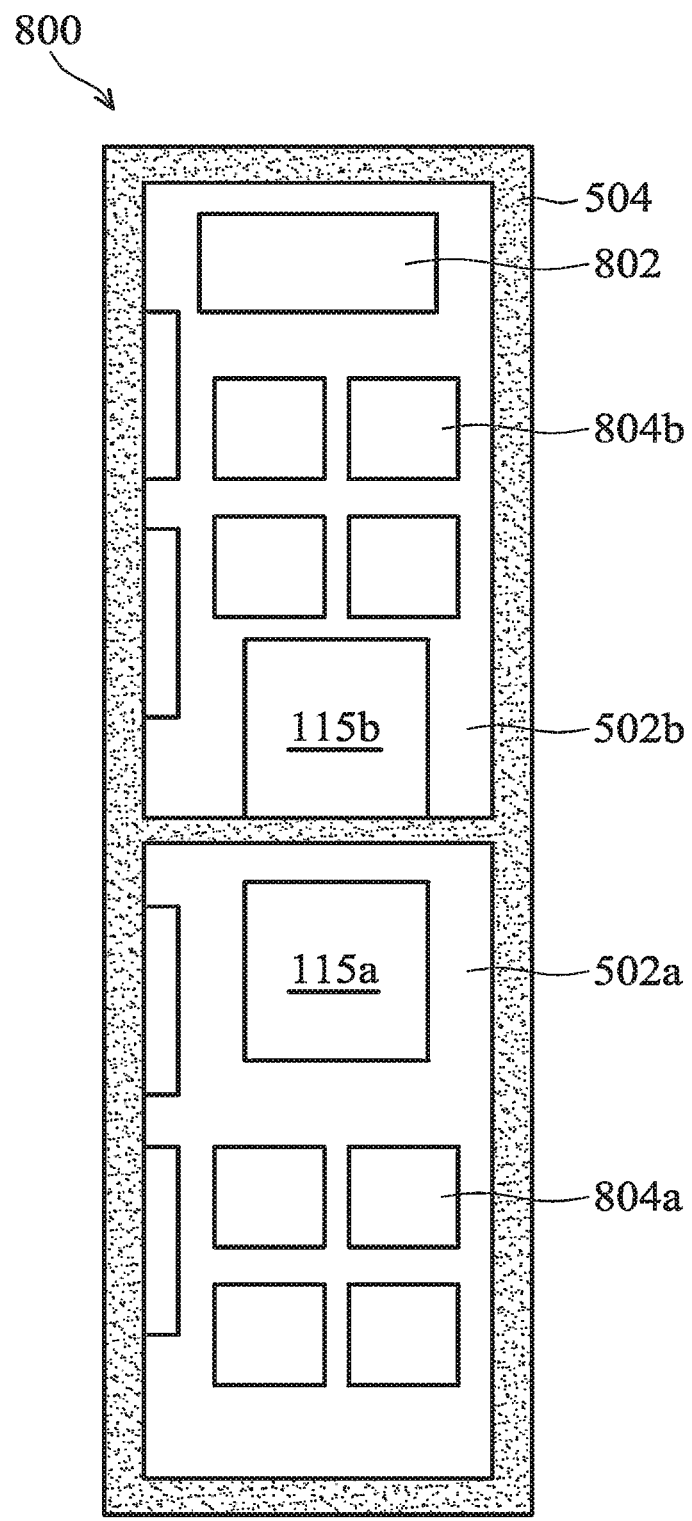
FIG. 8 is a plan view of a semiconductor package structure, in accordance with some embodiments of the disclosure.

FIG. 8 is a plan view of a semiconductor package structure 800, in accordance with some embodiments of the disclosure. The semiconductor package structure 800 is an exemplary embodiment including dual-band antenna structures. For example, the semiconductor package structure 800 may be used for 5G application. For brevity, some components are omitted.

As shown in FIG. 8, the semiconductor package structure 800 includes a plurality of first antenna structures 804a and a plurality of second antenna structures 804b. The first antenna structures 804a may be disposed over the first substrate 502a and electrically coupled to the first wiring structure in the first substrate 502a. The second antenna structures 804b may be disposed over the second substrate 502b and electrically coupled to the second wiring structure in the second substrate 502b. In some embodiments, the semiconductor package structure 800 further includes a connector 802 disposed over the second substrate 502b and not disposed over the first substrate 502a.

As mentioned above, the substrate of the semiconductor package structure can includes substrate partitions with different thicknesses for different applications. For example, the first antenna structures 804a and the second antenna structures 804b may be used for different bands, and the thickness of the first substrate 502a may be different than the thickness of the second substrate 502b. Therefore, antenna structures with different bands can be disposed in one semiconductor package structure 800. The reliability and the design flexibility of the semiconductor package structure 800 can be improved, and the cost of manufacture can be reduced, according to some embodiments.

According to some embodiments of the present disclosure, a semiconductor package structure having a plurality of substrates arranged side-by-side is provided. By using a plurality of small substrates, it is unnecessary to form a large substrate for bonding a great number of semiconductor dies thereon. Since it is easier to form a small substrate than a large substrate, the reliability of the semiconductor package structure can be improved, according to some embodiments.

Furthermore, according to some embodiments of the present disclosure, the substrates can have different thicknesses for different applications. In some embodiments, antenna structures for different bands can be disposed in one semiconductor package structure. Therefore, the design flexibility of the semiconductor package structure can be improved. Moreover, in these embodiments, thickness of components adjacent to the substrates can be adjusted to provide a planar surface.

In addition, according to some embodiments of the present disclosure, the semiconductor package structure includes a frame surrounding the substrates to increase the strength of the semiconductor package structure. Therefore, the thickness of the substrates can be reduced without decreasing the strength of the substrates. Furthermore, in some embodiments, depending on the material of the frame, the structural strength of the semiconductor package structure can be reinforced, or heat dissipation can be improved.

Figure 9A:
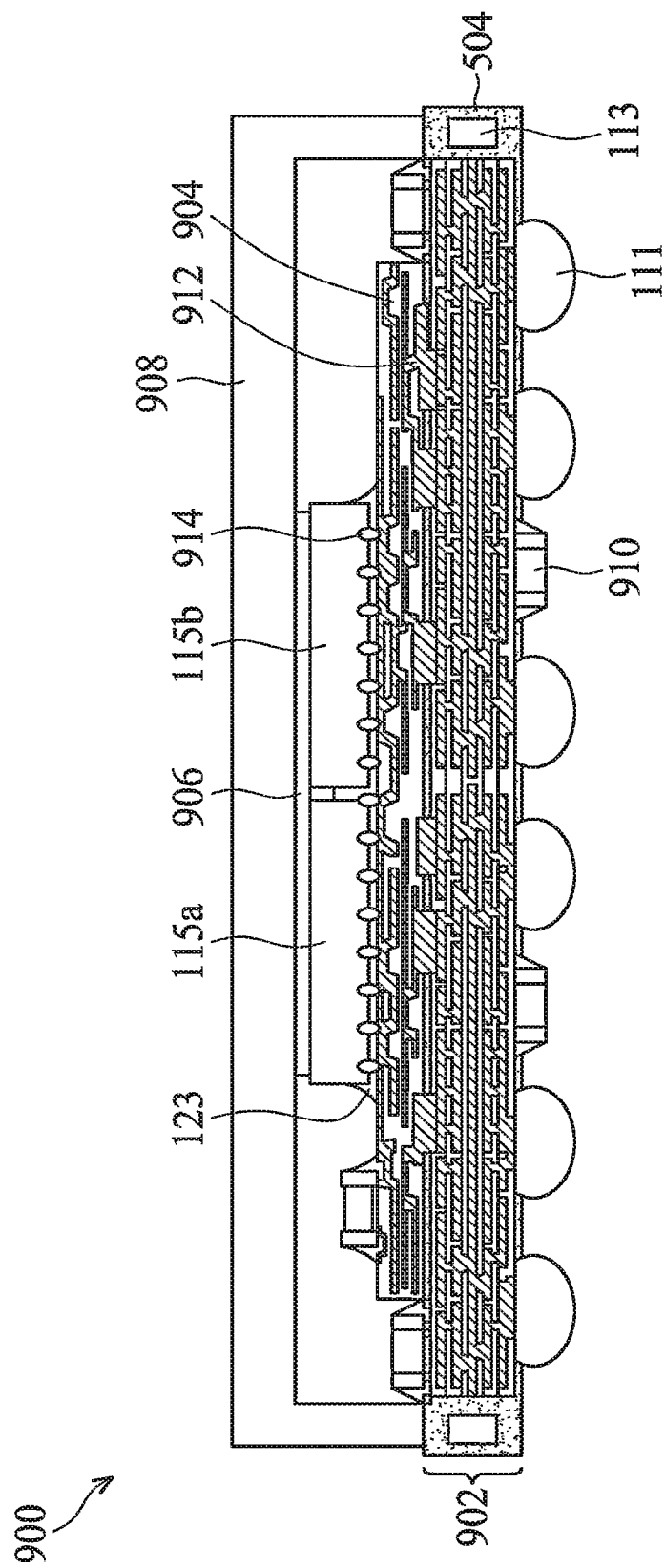
FIG. 9A is a cross-sectional view of a semiconductor package structure, in accordance with some embodiments of the disclosure.

FIG. 9A is a cross-sectional view of a semiconductor package structure 900, in accordance with some other embodiments of the disclosure. It should be noted that the semiconductor package structure 900 may include the same or similar components as that of the semiconductor package structures 100a and 100b which are illustrated in FIG. 1A and FIG. 1B, respectively. For the sake of simplicity, those components will not be discussed in detail again.

As shown in FIG. 9A, the semiconductor package structure 900 includes a substrate 902. The substrate 902 has a wiring structure therein. The substrate 902 may be the same as or similar to the substrate 101 of the semiconductor package structures 100a and 100b. For example, although not illustrated, the wiring structure in the substrate 902 may include one or more conductive pads, conductive vias, conductive layers, and conductive pillars.

In some embodiments, the semiconductor package structure 900 includes a molding material 504 and a frame 113 in the molding material 504, which surround the substrate 902 to enhance the structural strength of the semiconductor package structure 900. Therefore, it is unnecessary to use thick substrate for preventing warpage, so that the thickness of the substrate 902 can be reduced. Furthermore, coreless substrates can also be used for the substrate 902. As the result, cost can be reduced, complicated processing can be prevented, and the design flexibility of the semiconductor package structure 900 can be improved.

In some embodiments, the semiconductor package structure 900 includes a redistribution layer 904 disposed over the substrate 902 and electrically coupled to the wiring structure of the substrate 902. The redistribution layer 904 may be bonded to the substrate 902 through a plurality of conductive structures 912, such as solder balls, hybrid bonding structures, the like, or a combination thereof. In some embodiments, the solder balls may include tin or another suitable conductive material. In some embodiments, the hybrid bonding structures may include copper, copper alloy, aluminum, aluminum alloy, the like, or a combination thereof.

In some embodiments, the conductive structures 912 may be disposed in the molding material 504. The conductive structures 912 may extend from the redistribution layer 904 through the molding material 504 to the substrate 902. The redistribution layer 904 may be in contact with the molding material 504.

In some embodiments, the semiconductor package structure 900 includes a plurality of bump structures 111 disposed below the substrate 902. The bump structures 111 may be disposed on the surface of the substrate 902 opposite to the redistribution layer 904. The redistribution layer 904 may be electrically coupled to the bump structures 111 through the conductive structures 912 and the wiring structure of the substrate 902.

In some embodiments, the semiconductor package structure 900 includes electronic components 910 disposed on the substrate 902 and electrically coupled to the wiring structure of the substrate 902. The electronic components 910 may be capacitor, inductor, the like, or a combination thereof. The electronic components 910 may be disposed adjacent to the redistribution layer 904. The electronic components 910 may also be disposed between the bump structures 111. Furthermore, the electronic components 910 may be disposed on the redistribution layer 904 and electrically coupled to the wiring structure of the substrate 902 through the redistribution layer 904. Although the semiconductor package structure 900 includes five electronic components 910 disposed on both sides of the substrate 902 and on the redistribution layer 904 as illustrated, the present disclosure is not limit thereto. For example, the number of the electronic components 910 may be more or less than five.

In some embodiments, the semiconductor package structure 900 also includes a first semiconductor die 115a and a second semiconductor die 115b bonded onto the redistribution layer 904. The first semiconductor die 115a and the second semiconductor dies 115b may be arranged side-by-side. Although two semiconductor dies are illustrated, the semiconductor package structure 900 may include one or more than two semiconductor dies. In some embodiments, the first semiconductor die 115a and the second semiconductor dies 115b are bonded onto the redistribution layer 902 through a plurality of bumps 914. The bumps 914 may be micro bumps and may be made of copper.

In some embodiments, the semiconductor package structure 900 includes an underfill layer 123 between the first semiconductor die 115a and the second semiconductor dies 115b and the redistribution layer 904 to protect the bumps 914. The bumps 914 may be disposed in the underfill layer 123. The underfill layer 123 may surround the first semiconductor die 115a and the second semiconductor dies 115b, and may cover a portion of sidewalls of the first semiconductor die 115a and the second semiconductor die 115b. The underfill layer 123 may extend partially into the space between the first semiconductor die 115a and the second semiconductor die 115b.

In some embodiments, the upper surfaces of the first semiconductor die 115a and the second semiconductor dies 115b facing away from the redistribution layer 904 are exposed by the underfill layer 123, such that a heat spreader 908 can directly attached to the upper surfaces of the first semiconductor die 115a and the second semiconductor dies 115b through a thermal interface material 906. As a result, the heat-dissipation efficiency of the semiconductor package structure 100a can be improved. The thermal interface material 906 may be in physical contact with the upper surfaces of the first semiconductor die 115a and the second semiconductor dies 115b. The thermal interface material 906 may be a polymer having a good thermal conductivity.

As shown in FIG. 9A, the sidewalls of the heat spreader 908 may be disposed over the frame 113. In particular, the heat spreader 908 has an upper portion on the thermal interface material 906, and a lower portion on the edge of the upper portion. The lower portion of the heat spreader 908 may be disposed on the portion of the molding material 504 which is directly above the frame 113. That is, the lower portion of the heat spreader 908 may be outside the substrate 902. In some embodiments, the lower portion of the heat spreader 908 outside the sidewalls of the substrate 902, rather than on the upper surface of the substrate 902, can leave more space for mounting more electronic components 910 onto the upper surface of the substrate 902 (please confirm). Similarly, more space can be used for disposing a wider redistribution layer 904, such that more semiconductor dies 115a, 115b and/or more electronic components 910 can be bonded thereon.

In some embodiments, the heat spreader 908 covers the first semiconductor die 115a, the second semiconductor die 115b, the redistribution layer 904 and some of the electronic components 910 to protect these components. The heat spreader 908 may be formed of metal, metal alloy, or the like. For example, the heat spreader 908 may include Al, Cu, Ni, Co, the like, an alloy thereof, or a combination thereof. The heat spreader 908 may also be formed of a composite material, such as silicon carbide, aluminum nitride, graphite, the like, or a combination thereof.

Figure 9B:
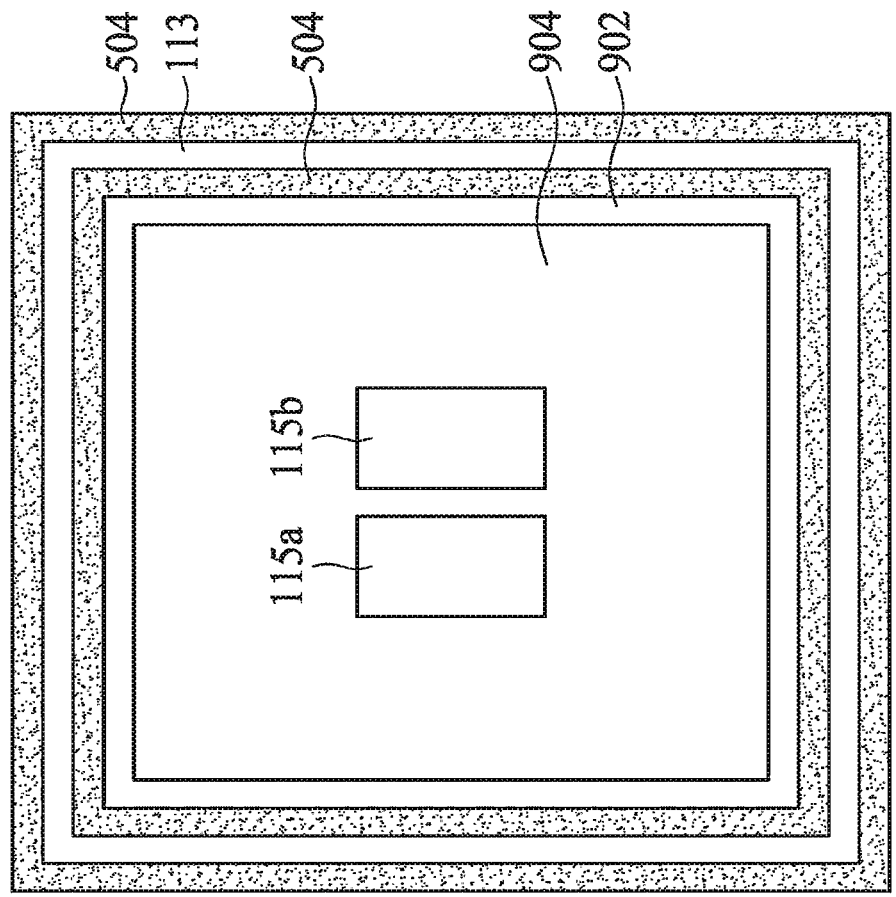
FIG. 9B is a plan view of a semiconductor package structure, in accordance with some embodiments of the disclosure.

Referring to FIG. 9B, which is a plan view of the semiconductor package structure 900 shown in FIG. 9A. It should be noted that FIG. 9B is the plan view from the top of the semiconductor package structure 900, and some components are omitted for brevity.

As shown in FIG. 9B, the frame 113 and the molding material 504 enclose the substrate 902 to enhance the structural strength of the semiconductor package structure 900 according to some embodiments. The molding material 504 may surround the frame 113. The frame 113 and the substrate 902 may be spaced apart by the molding material 504. In some embodiments, the lower portion of the heat spreader 908 (FIG. 9A) disposed over the frame 113 also enclose the first semiconductor die 115a, the second semiconductor die 115b, and the redistribution layer 904.

In the above embodiment, the present disclosure provides the frame 113 and the molding material 504 surrounding the substrate 902 to enhance the structural strength of the semiconductor package structure 900. As a result, the thickness of the substrate 902 can be reduced, thereby preventing the issues caused by the increase in thickness. Furthermore, the lower portion of the heat spreader 908 disposed outside the substrate 902 can leave more space for disposing more semiconductor dies 115a, 115b and/or more electronic components 910. Accordingly, the design flexibility of the semiconductor package structure 900 can be improved.

Figure 10A:
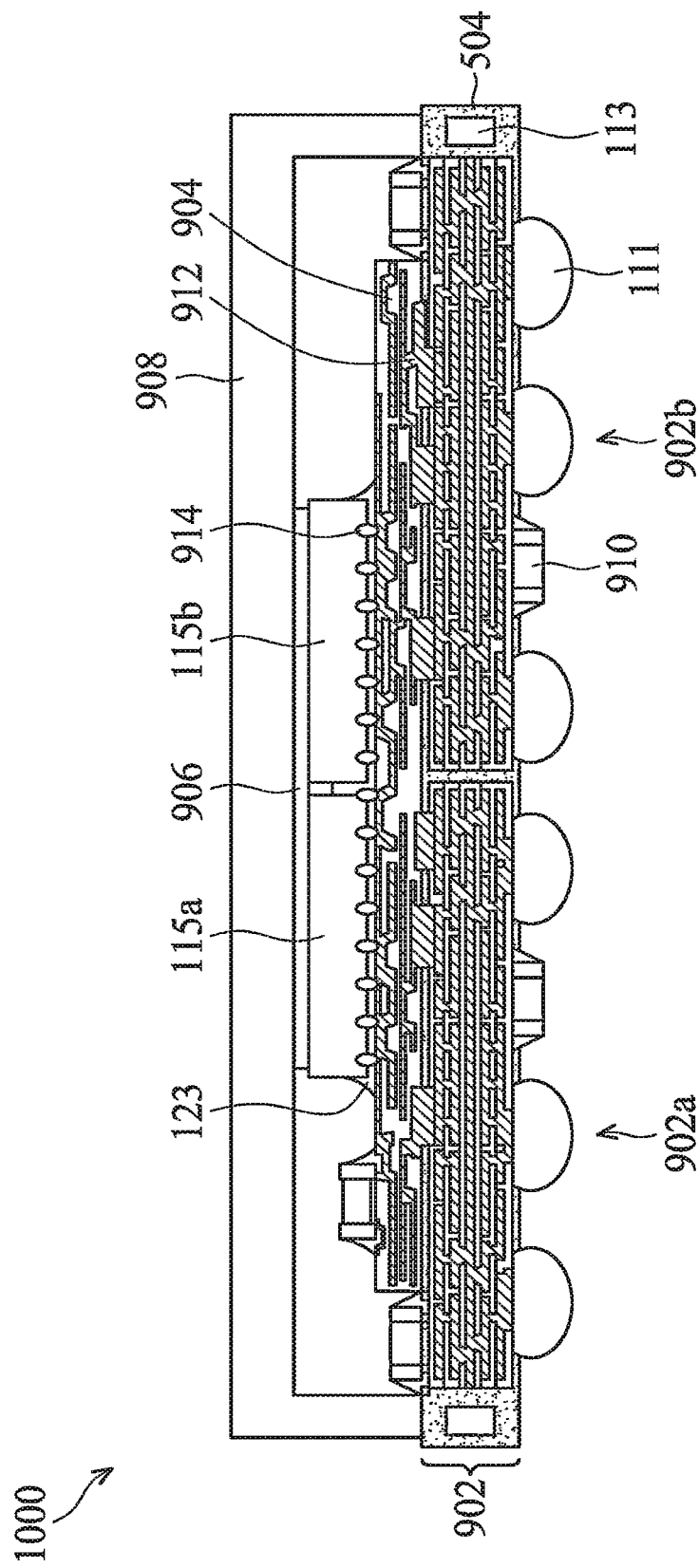
FIG. 10A is a cross-sectional view of a semiconductor package structure, in accordance with some embodiments of the disclosure.

FIG. 10A is a cross-sectional view of a semiconductor package structure 1000, in accordance with some other embodiments of the disclosure. The semiconductor package structure 1000 may include the same or similar components as that of the semiconductor package structure 900, and for the sake of simplicity, those components will not be discussed in detail again. In comparison with the embodiment of FIGS. 9A and 9B, the following embodiment provides a plurality of substrates surrounded by the frame and the molding material to improve the reliability and the design flexibility of the semiconductor package structure.

As shown in FIG. 10A, the semiconductor package structure 1000 includes a first substrate 902a and a second substrate 902b. The first substrate 902a and the second substrate 902b may be arranged side-by-side. By using a plurality of small substrates instead of a large substrate, the reliability and the design flexibility of the semiconductor package structure can be improved according to some embodiments of the present disclosure. The first substrate 902a and the second substrate 902b may be homogenous or heterogeneous. That is, the first substrate 902a and the second substrate 902b may be the same as or different from each other.

In some embodiments, the first substrate 902a has a first wiring structure therein, and the second substrate 902b has a second wiring structure therein. The redistribution layer 904 is electrically coupled to the first wiring structure in the first substrate 902a and the second wiring structure in the second substrate 902b. The first wiring structure in the first substrate 902a may be the same as or different from the second wiring structure in the second substrate 902b. For example, each of the first wiring structure in the first substrate 902a and the second wiring structure in the second substrate 902b may include one or more conductive pads, conductive vias, conductive layers, and conductive pillars, and the number of these components may be different in the first substrate 902a and in the second substrate 902a.

In some embodiments, the first substrate 902a and the second substrate 902b are surrounded by the molding material 504 and the frame 113. The first substrate 902a and the second substrate 902b may be separated by the molding material 504.

Although the thickness of the first substrate 902a and the thickness of the second substrate 902b are substantially the same in Figures, the present disclosure is not limit thereto. In some embodiments, the thickness of the first substrate 902a and the thickness of the second substrate 902b are different for different semiconductor dies formed thereon. In this case, the size of components adjacent to the first substrate 902a and/or the second substrate 902b may be adjusted to provide a planar surface. For example, in embodiments where the first substrate 902a is thicker than the second substrate 902b, the conductive structures 912 disposed between the redistribution layer 904 and the second substrate 902b may be thicker than the conductive structures 912 disposed between the redistribution layer 904 and the first substrate 902a, so that a planar surface can be provided for bonding the redistribution layer 904 thereon.

Figure 10B:
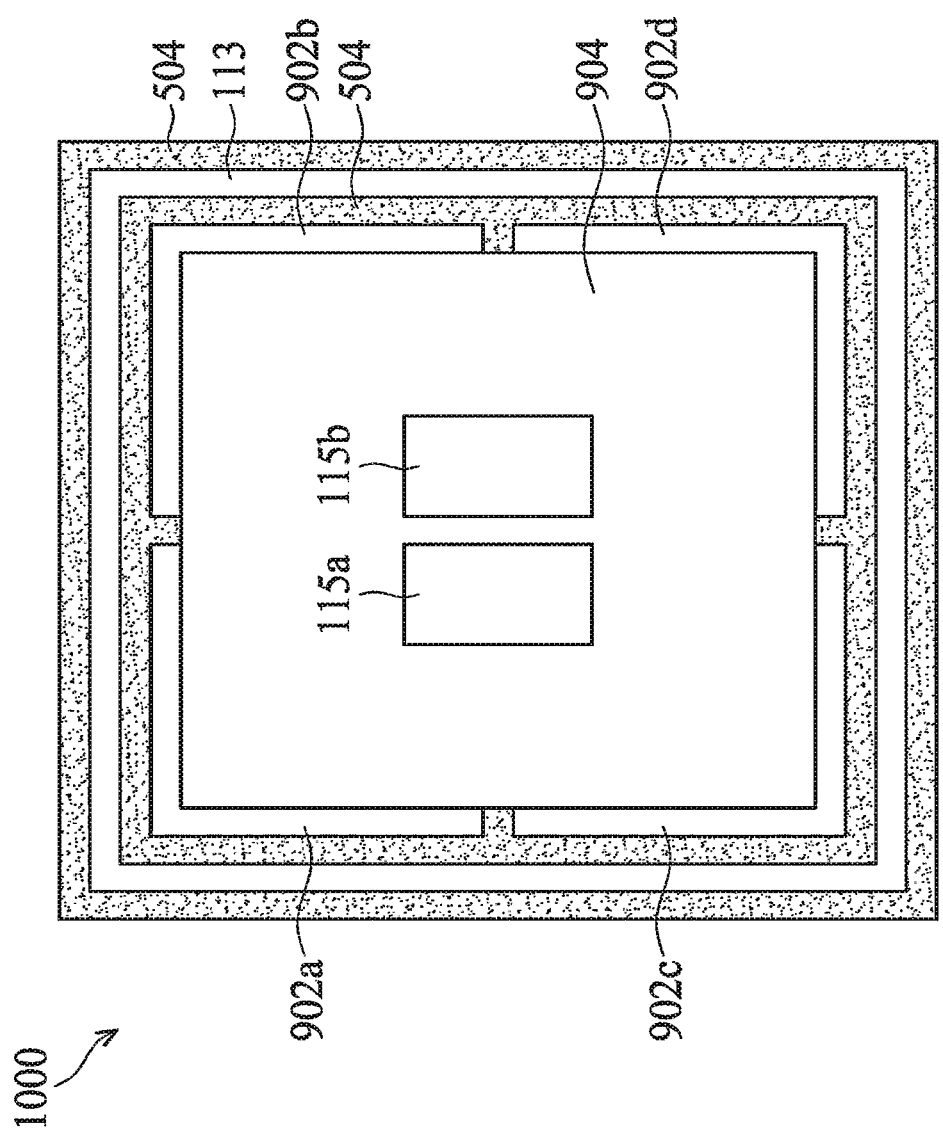
FIG. 10B is a plan view of a semiconductor package structure, in accordance with some embodiments of the disclosure.

Referring to FIG. 10B, which is a plan view of the semiconductor package structure 1000 shown in FIG. 10A, except four substrates are illustrated in FIG. 10B. It should be noted that FIG. 10B is the plan view from the top of the semiconductor package structure 1000, and some components are omitted for brevity.

As shown in FIG. 10B, the semiconductor package structure 1000 includes the substrates 902a, 902b, 902c, and 902d arranged side-by-side. The redistribution layer 904 may cover the substrates 902a, 902b, 902c, and 902d. The substrates 902a, 902b, 902c, and 902d may be surrounded by the molding material 504 and the frame 113. In some embodiments, the substrates 902a, 902b, 902c, and 902d are separated by the molding material 504. The molding material 504 may include a cross shape between the substrates 902a, 902b, 902c, and 902d. The substrates 902a, 902b, 902c, 902d and the frame 113 may be molded in the same process or in different processes.

In some embodiments, the frame 113 and material 504 enclose the substrates 902a, 902b, 902c, and 902d to enhance the structural strength of the semiconductor package structure 900. The molding material 504 may surround the frame 113. The frame 113 and the substrates 902a, 902b, 902c, 902d may be spaced apart by the molding material 504. In some embodiments, the lower portion of the heat spreader 908 (FIG. 10A) disposed over the frame 113 also encloses the first semiconductor die 115a, the second semiconductor die 115b, and the redistribution layer 904.

As shown in FIG. 10B, the first semiconductor die 115a may cross over the substrates 902a and 902c, and the second semiconductor die 115a may cross over the substrates 902b and 902d according to some embodiments. The first semiconductor die 115a may be electrically coupled to the wiring structures in the substrates 902a and 902c, and the second semiconductor die 115b may be electrically coupled to the wiring structures in the substrates 902b and 902d. However, the present disclosure is not limit thereto, and the number and/or the size of the substrates and the semiconductor dies may be adjusted. For example, the semiconductor package structure 1000 may include four semiconductor dies, and each of the semiconductor dies may be electrically coupled to one of the wiring structures in the substrates 902a, 902b, 902c, 902d, respectively.

Alternatively, the semiconductor package structure 1000 may include three substrates 902a, 902b, 902c, and the size of the substrate 902b may be larger than the sizes of the substrates 902a and 902c according to an embodiment. In this embodiment, the first semiconductor die 115a may be electrically coupled to the wiring structures in the substrates 902a and 902c, and the second semiconductor die 115b may be electrically coupled to the wiring structure in the substrates 902b. Furthermore, the molding material 504 may be T-shaped between the substrates 902a, 902b, 902c in this embodiment.

In the above embodiment, the present disclosure provides a plurality of substrates, such as substrates 902a, 902b, 902c, 902d, surrounded by the frame 113 and the molding material 504. By using a plurality of small substrates instead of a large substrate, the reliability and the design flexibility of the semiconductor package structure 1000 can be improved. Furthermore, the frame 113 and the substrates may be molded in the same process to omit an additional process for the combination of the frame 113 and the substrates.

Figure 11A:
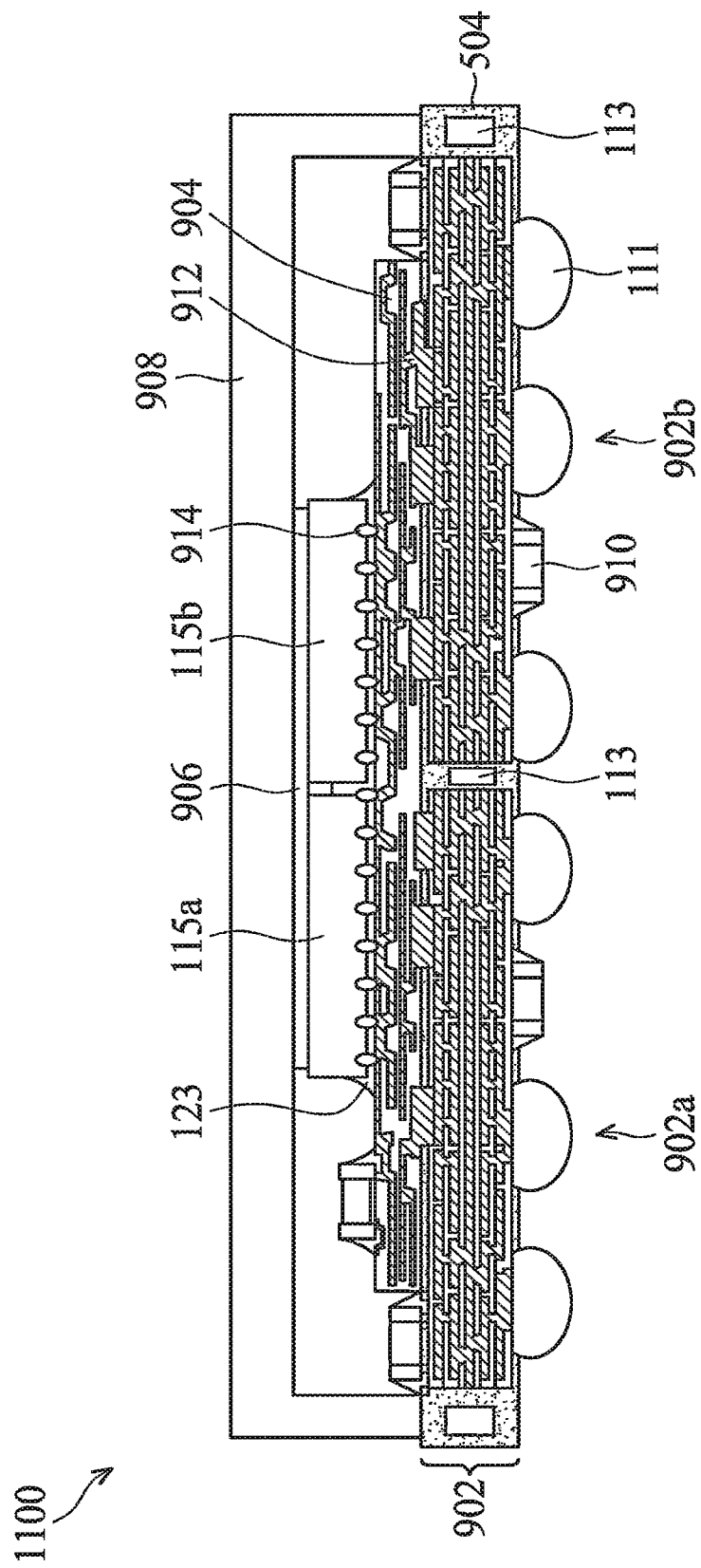
FIG. 11A is a cross-sectional view of a semiconductor package structure, in accordance with some embodiments of the disclosure.

FIG. 11A is a cross-sectional view of a semiconductor package structure 1100, in accordance with some other embodiments of the disclosure. The semiconductor package structure 1100 may include the same or similar components as that of the semiconductor package structure 1000, and for the sake of simplicity, those components will not be discussed in detail again. In comparison with the embodiment of FIGS. 10A and 10B, the following embodiment provides a plurality of substrates each surrounded by a molding material and a frame to further reinforce the strength of the semiconductor package structure.

As shown in FIG. 11A, the semiconductor package structure 1100 includes a first substrate 902a and a second substrate 902b. The first substrate 902a and the second substrate 902b may be arranged side-by-side. Each of the first substrate 902a and the second substrate 902b may be surrounded by the molding material 504 and the frame 113. In other words, the first substrate 902a and the second substrate 902b may be separated by the molding material 504 and the frame 113. As a result, the structural strength of the semiconductor package structure can be further reinforced. In some embodiments, the frame 113 is spaced apart from the first substrate 902a and the second substrate 902b by the molding material 504.

Figure 11B:
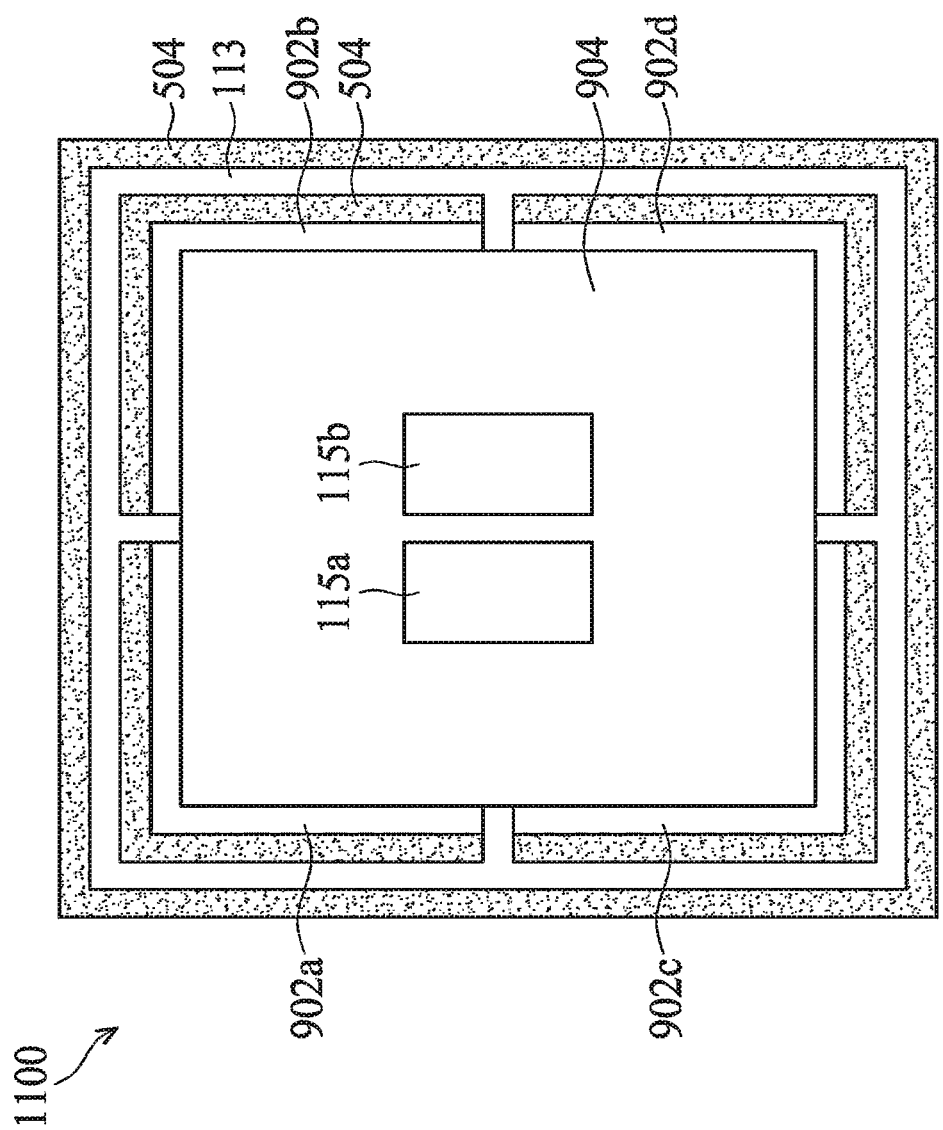
FIG. 11B is a plan view of a semiconductor package structure, in accordance with some embodiments of the disclosure.

Referring to FIG. 11B, which is a plan view of the semiconductor package structure 1100 shown in FIG. 11A, except four substrates are illustrated in FIG. 11B. It should be noted that FIG. 11B is the plan view from the top of the semiconductor package structure 1100, and some components are omitted for brevity.

As shown in FIG. 11B, the semiconductor package structure 1100 includes the substrates 902a, 902b, 902c, and 902d arranged side-by-side. The redistribution layer 904 may cover the substrates 902a, 902b, 902c, and 902d. Each of the substrates 902a, 902b, 902c, and 902d may be surrounded by the molding material 504 and the frame 113. The substrates 902a, 902b, 902c, and 902d may be separate by the molding material 504 and the frame 113. The substrates 902a, 902b, 902c, 902d and the frame 113 may be molded in the same process or in different processes.

In some embodiments, the frame 113 has a peripheral portion enclosing the substrates 902a, 902b, 902c, 902d, and a central portion separating the substrates 902a, 902b, 902c, 902d. In particular, the central portion of the frame 113 may include a cross shape. The molding material 504 may surround the frame 113, including the peripheral portion and the central portion of the frame 113. The frame 113 and the substrates 902a, 902b, 902c, 902d may be spaced apart by the molding material 504. In some embodiments, the lower portion of the heat spreader 908 (FIG. 11A) disposed over the peripheral portion of the frame 113 also encloses the first semiconductor die 115a, the second semiconductor die 115b, and the redistribution layer 904.

As shown in FIG. 11B, the first semiconductor die 115a may cross over the substrates 902a and 902c, and the second semiconductor die 115a may cross over the substrates 902b and 902d according to some embodiments. The first semiconductor die 115a may be electrically coupled to the wiring structures in the substrates 902a and 902c, and the second semiconductor die 115b may be electrically coupled to the wiring structures in the substrates 902b and 902d. As described previously, the number and/or the size of the substrates and the semiconductor dies may be adjusted. For example, the semiconductor package structure 1100 may include three substrates 902a, 902b, 902c, and the size of the substrate 902b may be larger than the sizes of the substrates 902a and 902c according to an embodiment. In this embodiment, the first semiconductor die 115a may be electrically coupled to the wiring structures in the substrates 902a and 902c, and the second semiconductor die 115b may be electrically coupled to the wiring structure in the substrates 902b. Furthermore, the frame 113 may be T-shaped between the substrates 902a, 902b, 902c in this embodiment.

In the above embodiment, the present disclosure provides a plurality of substrates, such as substrates 902a, 902b, 902c, 902d, and each of the substrates is surrounded by the frame 113 and the molding material 504 to further reinforce the strength of the semiconductor package structure 1100. Furthermore, the frame 113 and the substrates may be molded in the same process to omit an additional process for the combination of the frame 113 and the substrates.

In summary, the present disclosure provides a frame and a molding material surrounding the substrate to enhance the structural strength of the semiconductor package structure. Therefore, the thickness of the substrate can be reduced, and the issues caused by the increase in thickness can be prevented. Furthermore, according to some embodiments, the lower portion of the heat spreader disposed outside the substrate can leave more space for more semiconductor dies and/or for more electronic components. Accordingly, the design flexibility of the semiconductor package structure can be improved.

In addition, in some embodiments, a frame and a molding material surround a plurality of substrates to improve the reliability and the design flexibility of the semiconductor package structure. Furthermore, in some embodiments, each of the substrates is surrounded by the frame and the molding material to further reinforce the strength of the semiconductor package structure.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package. In addition, the arrangements, the shapes, and the locations of the holes in the substrate can be adjusted according to the types of the application.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a plurality of substrates arranged side-by-side and having a plurality of wiring structures, wherein the plurality of substrates are surrounded by a molding material;
a frame disposed in the molding material and surrounding the plurality of substrates, the plurality of substrates being between portions of the frame;
a redistribution layer disposed over the plurality of substrates and electrically coupled to the plurality of wiring structures; and
a semiconductor die disposed over the redistribution layer.

2. The semiconductor package structure as claimed in claim 1, wherein the plurality of substrates are homogenous or heterogeneous.

3. The semiconductor package structure as claimed in claim 1, wherein the plurality of substrates are separated by the molding material.

4. The semiconductor package structure as claimed in claim 1, wherein the plurality of substrates are separated by the frame.

5. The semiconductor package structure as claimed in claim 4, wherein the frame includes a cross shape.

6. The semiconductor package structure as claimed in claim 1, wherein the redistribution layer is bonded onto the plurality of substrates through solder balls and/or hybrid bonding structures.

7. A semiconductor package structure, comprising:
a plurality of substrates arranged side-by-side and having a plurality of wiring structures,
wherein the plurality of substrates are surrounded by a molding material;
a frame disposed in the molding material and surrounding the plurality of substrates, the plurality of substrates being between portions of the frame;
a redistribution layer disposed over the plurality of substrates and electrically coupled to the plurality of wiring structures;
a plurality of semiconductor dies disposed over the redistribution layer and arranged side-by-side;
an electronic component disposed on the plurality of substrates or the redistribution layer; and
a heat spreader disposed over the frame.

8. The semiconductor package structure as claimed in claim 7, wherein the plurality of semiconductor dies are surrounded by an underfill layer.

9. The semiconductor package structure as claimed in claim 7, wherein the heat spreader covers the plurality of semiconductor dies, the redistribution layer and the electronic component.

10. The semiconductor package structure as claimed in claim 7, wherein the heat spreader is attached to the plurality of semiconductor dies through a thermal interface material.

11. A semiconductor package structure, comprising:
a plurality of substrates arranged side-by-side and having a plurality of wiring structures, wherein the plurality of substrates are surrounded by a molding material;
a frame disposed in the molding material and surrounding the plurality of substrates;
a redistribution layer disposed over the plurality of substrates and electrically coupled to the plurality of wiring structures; and
a semiconductor die disposed over the redistribution layer,
wherein the plurality of substrates are separated by the molding material.

* * * * *